(12) United States Patent
Cheng et al.

(10) Patent No.: US 11,823,964 B2
(45) Date of Patent: Nov. 21, 2023

(54) DEPOSITION SYSTEM AND METHOD

(71) Applicant: Taiwan Semiconductor Manufacturing Co., Ltd., Hsinchu (TW)

(72) Inventors: Wen-Hao Cheng, Hsinchu (TW); Yen-Yu Chen, Hsinchu (TW); Yi-Ming Dai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 276 days.

(21) Appl. No.: 17/233,263

(22) Filed: Apr. 16, 2021

(65) Prior Publication Data

US 2022/0336297 A1    Oct. 20, 2022

(51) Int. Cl.
| | |
|---|---|
| *H01L 21/66* | (2006.01) |
| *C23C 14/34* | (2006.01) |
| *C23C 14/54* | (2006.01) |
| *G01N 23/223* | (2006.01) |
| *H01J 37/34* | (2006.01) |
| *H01L 21/285* | (2006.01) |
| *H01L 21/67* | (2006.01) |

(52) U.S. Cl.
CPC .............. *H01L 22/26* (2013.01); *C23C 14/34* (2013.01); *C23C 14/547* (2013.01); *G01N 23/223* (2013.01); *H01J 37/347* (2013.01); *H01L 21/2855* (2013.01); *H01L 21/67253* (2013.01); *G01N 2223/076* (2013.01); *G01N 2223/61* (2013.01); *G01N 2223/633* (2013.01); *H01J 2237/24585* (2013.01); *H01J 2237/332* (2013.01)

(58) Field of Classification Search
CPC ..... H01J 37/347; H01J 37/3405; C23C 14/54; C23C 14/35; C23C 14/547; C23C 14/545; C23C 14/542
See application file for complete search history.

(56) References Cited

U.S. PATENT DOCUMENTS

| | | | |
|---|---|---|---|
| 6,506,290 B1 | 1/2003 | Ono | |
| 2002/0000374 A1 | 1/2002 | Buchanan et al. | |
| 2003/0090676 A1 | 5/2003 | Goebel et al. | |
| 2004/0002171 A1 | 1/2004 | Gotkis et al. | |
| 2005/0247877 A1* | 11/2005 | Mackin | C23C 14/547 250/341.1 |
| 2020/0024727 A1* | 1/2020 | Boruah | G01B 11/0625 |

(Continued)

FOREIGN PATENT DOCUMENTS

| | | |
|---|---|---|
| TW | 201903891 A | 1/2019 |
| TW | 201923867 A | 6/2019 |

*Primary Examiner* — Jaehwan Oh
(74) *Attorney, Agent, or Firm* — SEED IP LAW GROUP LLP

(57) ABSTRACT

A deposition system is provided capable of measuring at least one of the film characteristics (e.g., thickness, resistance, and composition) in the deposition system. The deposition system in accordance with the present disclosure includes a substrate process chamber. The deposition system in accordance with the present disclosure includes a substrate pedestal in the substrate process chamber, the substrate pedestal configured to support a substrate, and a target enclosing the substrate process chamber. A shutter disk including an in-situ measuring device is provided.

20 Claims, 16 Drawing Sheets

(56) References Cited

U.S. PATENT DOCUMENTS

2021/0402558 A1\* 12/2021 Zuniga .................... B24B 37/30
2022/0044974 A1\* 2/2022 Dip ....................... C23C 16/308
2022/0181152 A1\* 6/2022 Sun ..................... H01L 21/0337

\* cited by examiner

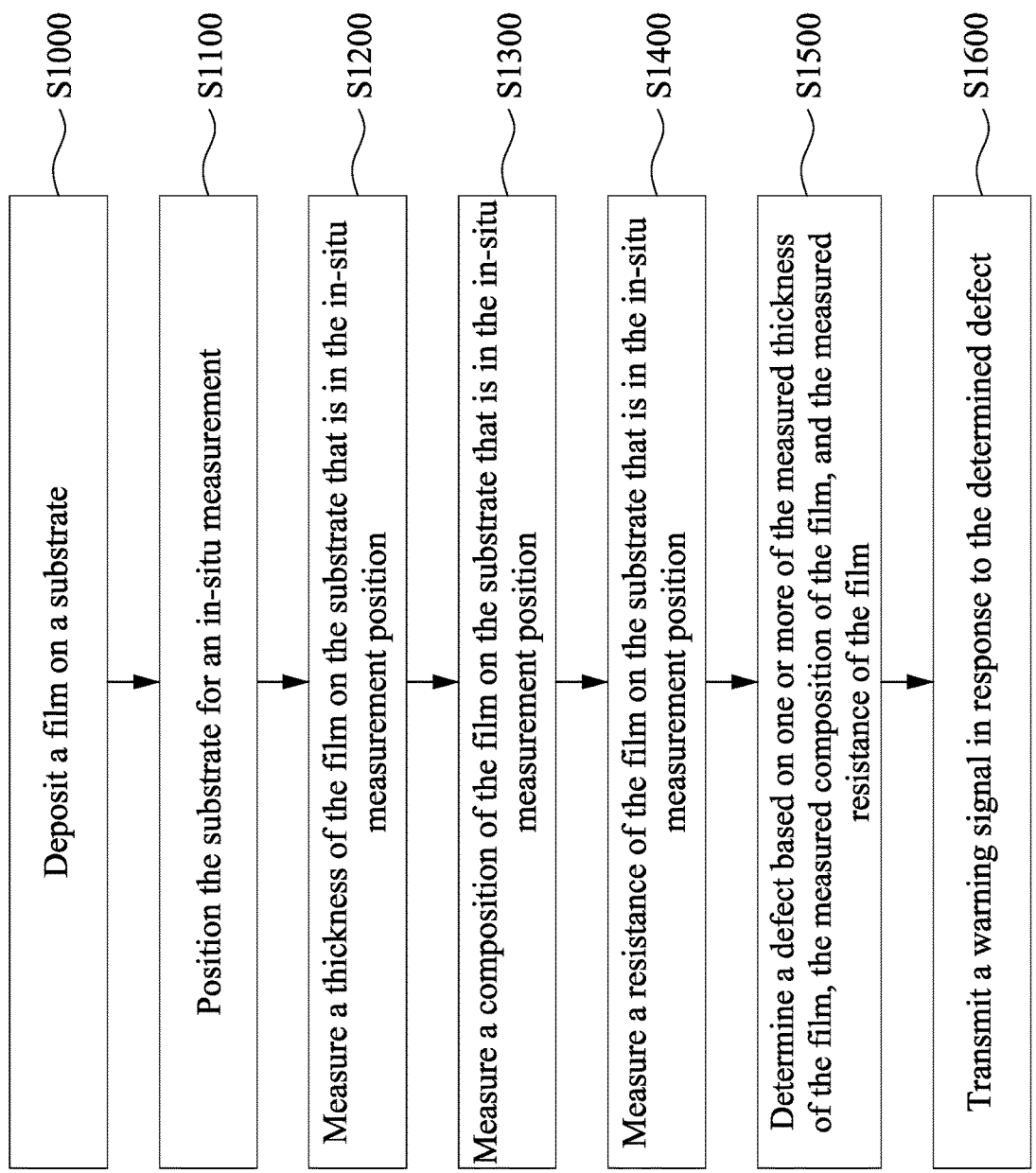

DEPOSITION SYSTEM AND METHOD

BACKGROUND

To produce semiconductor devices, a semiconductor substrate, such as a silicon wafer, which is a raw material for the semiconductor devices, must go through a sequence of complicated and precise process steps such as diffusion, ion implantation, chemical vapor deposition, photolithography, etch, physical vapor deposition, chemical mechanical polishing, and electrochemical plating.

The physical vapor deposition (PVD) is generally used to deposit one or more layers (e.g., thin film) on the semiconductor substrate. For example, sputtering, a form of the PVD, is commonly used in the semiconductor fabrication process to deposit complex alloys and metals, such as silver, copper, brass, titanium, titanium nitride, silicon, silicon nitride, and carbon nitride, on the substrate. The sputtering includes a target (source), and a substrate (wafer) positioned in parallel to each other in a vacuum enclosure (chamber). The target (cathode) is electrically grounded while the substrate (anode) has positive potential. Argon gas, which is relatively heavy and is a chemically inert gas, is commonly used as the sputtering ion species in the sputtering process. When the argon gas is introduced into the chamber, a plurality of collisions occurs with electrons released from the cathode. This causes the argon gas to lose its outer electrons and become positively charged argon ions. The positively charged argon ions are strongly attracted to the negative potential of the cathode target. When the positively charged argon ions strike the target surface, the momentum of the positively charged argon ions transfers to the target material to dislodge one or more atoms from the target material which eventually deposit on the substrate.

To maintain the quality of semiconductor devices, various metrology tools are used to measure the thickness, uniformity, and other characteristics of the layer deposited on the substrate during the deposition process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 16 is a flow chart illustrating a method of detecting a deposition defect in the thin film 904 deposited in the substrate process chamber 200 according to one or more embodiments of the present disclosure.

DETAILED DESCRIPTION

Figure 1:
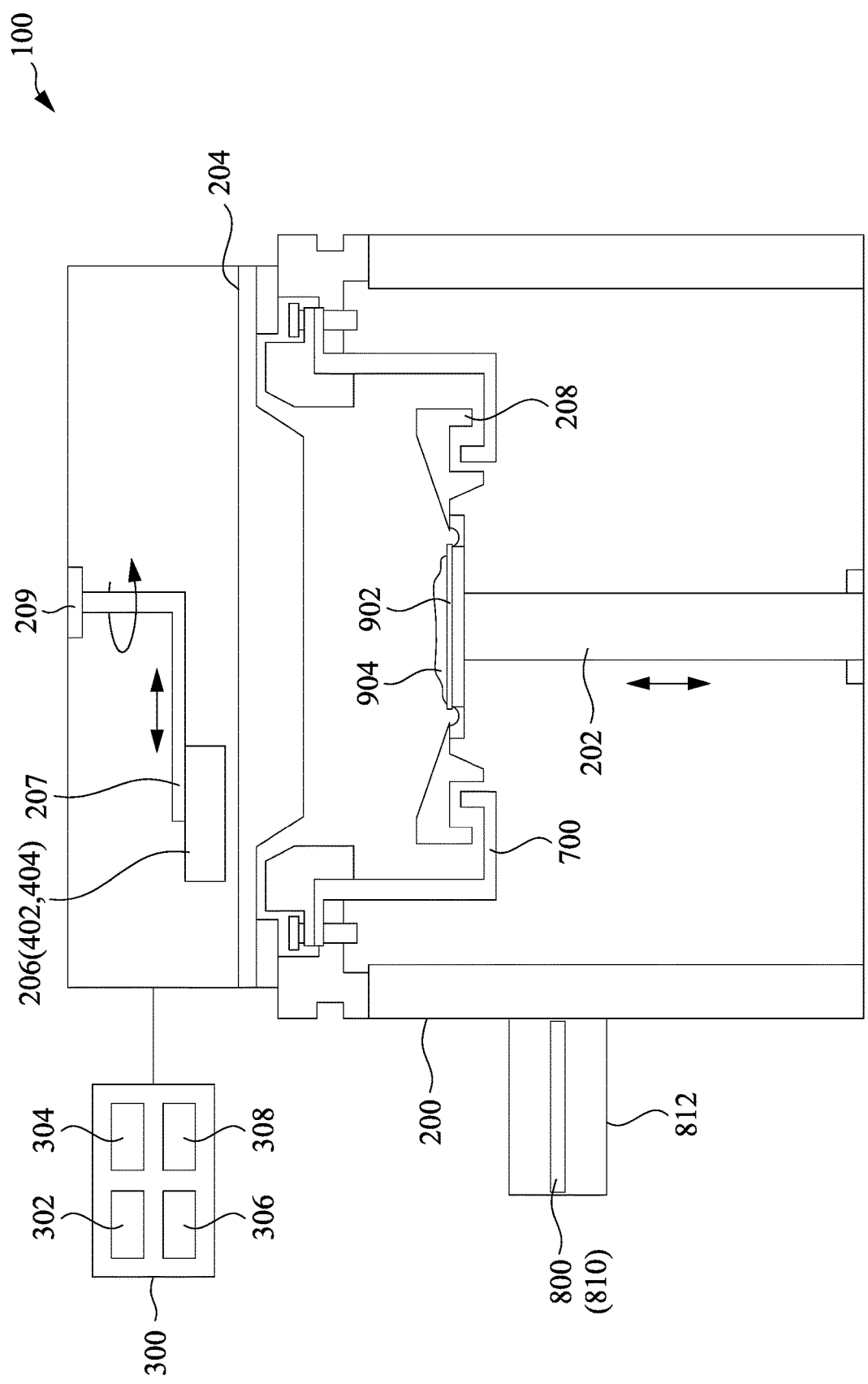
FIG. 1 is a sectional view of a deposition system 100 according to one or more embodiments in the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments in accordance with the subject matter described herein include a deposition system that is able to deposit a thin film (or a layer) on a substrate (e.g., wafer) and collect measurement data from the thin film on the substrate in the same chamber or at least in the same system (e.g., PVD tool, CVD tool, and tool equipped with at least one of PVD chamber or CVD chamber). An in-situ monitoring and/or measuring apparatus according to one or more embodiments disclosed in the present disclosure is able to measure various characteristics (e.g., thickness, resistance, and composition) from the thin film on the substrate.

Embodiments of such deposition system with the in-situ monitoring and/or measuring apparatus can monitor at least one of the film characteristics of the deposited layer (e.g., thin film) on the substrate after the deposition process is completed in the same chamber. In some embodiments of the present disclosure, based on the measurement data collected by the in-situ monitoring and/or measuring device in the deposition system, the deposition system is able to re-deposit an additional target material on the substrate while the substrate is still in the deposition system. In some embodiments, based on the measurement data collected by the in-situ monitoring and/or measuring apparatus in the deposition system, the deposition system is set to be offline from production early on for hardware tuning or process tuning before producing additional substrates with defects (e.g., thickness defect, resistance defect, and composition defect). Embodiments of such deposition system include a shutter disk that has at least one type of measurement device which collects at least one of the thin film characteristics (e.g., thickness, resistance, and composition) from the deposited layer on the substrate.

As discussed above, during the sputtering process, the positively charged argon ions strike the target surface, and the momentum of the positively charged argon ions transfers to the target material to dislodge one or more atoms from the target material which eventually deposit on the substrate. However, not all of the target material atoms are deposited on the substrate. Some of the target material atoms can deposit on surfaces between the target and the substrate, such as on an inner surface of a process shield that covers an inner wall of the PVD chamber and a top surface of a cover ring that covers a gap between a substrate pedestal and the process shield. Some of the target material atoms that are deposited on the surfaces between the target and the substrate are likely to be peeled off from the surfaces and re-deposited on the substrate during the sputtering process.

To prevent the target material on these surfaces from re-depositing onto the substrate in the PVD chamber, the deposition system is often programmed to run a periodic chamber conditioning recipe that is intended to form a coating layer that covers the target material atoms on these surfaces so the target material atoms on these surfaces stay on the surfaces until the process shield and the cover ring are replaced based on a periodic maintenance procedure. The shutter disk is used to cover the substrate pedestal during this chamber conditioning process to isolate the substrate pedestal from the coating layer and keep the substrate pedestal clean.

Additionally, the shutter disk is used to cover the substrate pedestal during a chamber cleaning process (which uses plasma to remove contaminants (e.g., oxides) from the surfaces such as the inner surface of the process shield) to prevent a top surface of the substrate pedestal from being etched by the plasma during the chamber cleaning process.

FIG. 1 is a sectional view of the deposition system 100 according to one or more embodiments in the present disclosure.

Referring to FIG. 1, the deposition system 100 includes a substrate process chamber 200, a substrate pedestal 202 that supports a substrate 902 (e.g., wafer) in the substrate process chamber 200, a target 204 enclosing the substrate process chamber 200, a magnet member 206 attached to a retractable arm 207 configured to rotate above the target 204 at different positions based on a position control signal from a controller 300 (e.g., positions closer to the center of the target 204 and positions closer to the edge of the target 204), a shutter disk 800, and a shutter disk storage 812 that stores the shutter disk 800 when the shutter disk 800 is not in use. In accordance with one or more embodiments of the present disclosure, the shutter disk 800 includes an in-situ monitoring and/or measuring device 810 (hereinafter "in-situ measuring device 810") that is able to measure at least one of the film characteristics (e.g., thickness, resistance, and composition) from a thin film 904 deposited on the substrate 902.

The embodiment illustrated in FIG. 1 shows that the substrate pedestal 202 is in a process positon (e.g., upper position) supporting the substrate 902 during a sputtering process. At this time, the thin film 904 is formed with material from the target 204 (and reactive gas supplied to the substrate process chamber 200) on the substrate 902. During the sputtering process, the shutter disk 800 with the in-situ measuring device 810 is stored in the shutter disk storage 812.

In some embodiments, the magnet member 206 is capable of rearranging its position on the target 204 (e.g., position closer to the center of the target 204, or position closer to the edge of the target 204) based on the measurement collected from the in-situ measuring device 810. In some embodiments, the magnet member 206 includes a permanent magnet member 402. In some embodiments, the magnet member 206 includes an electromagnet member 404. In some embodiments, the magnet member 206 includes a permanent magnet member 402 and an electromagnet member 404 together.

Permanent magnet member 402 is constructed of any suitable material that can stay magnetized over a long period without altering its magnetic property and is resistant to degradation caused by the external magnetic field. For example, the permanent magnet member 402 may be constructed of alnico alloy, ferrite and the like, an alloy of neodymium, iron and boron, or combinations thereof. Permanent magnet member 402 is not limited to being constructed from the exemplary material mentioned above but may be formed of any material that can stay magnetized over a long period without altering its magnetic property and is resistant to degradation caused by the external magnetic field.

Electromagnet member 404 is constructed of any suitable material that can stay magnetized when an electric current is applied to the material and is resistant to degradation caused by the external magnetic field. For example, the electromagnet member 404 may be constructed of a coil of copper wire, or other electrically conductive wire, wound around a core of a material that when an electric current is flowed through the electrically conductive wire produces a magnetic field. Examples of materials suitable as a core for an electromagnet include, iron, nickel, or cobalt. Electromagnet member 404 is not limited to being constructed from the exemplary material mentioned above but may be formed of any material that can stay magnetized when the electric current is applied to the material and is resistant to degradation caused by the external magnetic field.

As discussed above, in some embodiments of the present disclosure, the magnet member 206 is capable of rearranging its position on the target 204 based on the measurement collected from the in-situ measuring device 810. In some embodiments, by changing the position of the magnet member 206 that precisely rotates above the target 204, the magnetic field generated by the magnet member 206 is re-directed from a first location to a second location on the target 204. As a result, a magnitude of the magnetic field applied to the target 204 decreases at the first location and increases at the second location. In other words, a deposition system 100 in accordance with some embodiments described herein can selectively adjust an amount or magnitude of the magnetic field applied to a specific area on the target 204. By increasing the amount of the magnetic field applied to the specific area on the target 204 using the magnet member 206, an ion bombardment on the specific area on the target 204 also increases. The higher or increased ion bombardment means more target material (e.g., metal atoms) are dislodged from the specific location of the target 204. Ultimately, the dislodged material from the specific location of the target 204 is deposited on a corresponding location of the substrate 902. In accordance with some embodiments of the present disclosure, the deposition system 100 is configured to deposit the thin film 904 on the substrate 902 and re-deposit more target material on the substrate 902 based on measurement data (e.g., thickness of the thin film 904 on the substrate 902) received from the in-situ measuring device 810 while the substrate 902 is still in the deposition system 100. Details of the in-situ measuring device 810 will be provided later in the present disclosure.

Controller 300 controls the movement of the retractable arm 207 (e.g., extend, retract, and/or rotate) and current to the electromagnet member 404 in the magnet member 206. A first end of the retractable arm 207 is coupled to a rotating mechanism 209 (e.g., motor) that precisely rotates the retractable arm 207 over the target 204. In accordance with one or more embodiments of the present disclosure, the controller 300 includes an input circuitry 302, a memory 304, a processor 306, and an output circuitry 308. Controller 300 includes the (computer) processor 306 configured to perform the various functions and operations described herein including receiving input data from various data sources (e.g., measurement data from the in-situ measuring device 810) via the input circuitry 302 and transmitting output data (e.g., current control signal for the electromagnet member 404, position control signal for the retractable arm 207 and the rotating mechanism 209, and warning signal for indicating detection of a defect with the thin film 904 based on the measurement data from the in-situ measuring device 810) via the output circuitry 308. Input circuitry 302 receives the thickness, composition, and/or sheet resistance measurements on the thin film 904 measured by the in-situ measuring device 810. In some embodiments of the present disclosure, the thin film thickness, composition, and/or sheet resistance measurements are taken at one location or a plurality of (predetermined) locations on the substrate 902. In some embodiments, the input circuitry 302 also receives process specification information such as a target thin film thickness, target sheet resistance, and/or target thin film composition from an operator or an automated material handling system (AMHS). Details of the input circuitry 302, memory 304, output circuitry 308, and the in-situ measuring device 810 will be provided later in the present disclosure.

In some embodiments, the processor 306 also determines at least one area or location (e.g., center area, wafer edge area, and area between the center area and the wafer edge area) where the thickness of the thin film is out of or within the process specification, e.g., differs from an average thickness by being less than or greater than an average thickness. In some embodiments, the processor 306 determines at least one area (or location) where sheet resistance of the thin film is less or more than the process specification, e.g., less than or greater than a range of sheet resistance. In some embodiments, the processor 306 determines at least one area (or location) where the thin film composition is out of or within the process specification, e.g., less than or greater than a range of target composition. Memory 304 stores information received via the input circuitry 302 and the processed data such as the determined location (area) information from the processor 306. Memory 304 may be or include any computer-readable storage medium, including, for example, read-only memory (ROM), random access memory (RAM), flash memory, hard disk drive, optical storage device, magnetic storage device, electrically erasable programmable read-only memory (EEPROM), organic storage media, or the like. Output circuitry 308 transmits the current control signal for current applied to the magnet member 206, a position control signal for the retractable arm 207 and the rotating mechanism 209 (e.g., extending position, retracting position, or positions between the extending position and the retracting position), and the warning signal for indicating detection of a defect with the thin film 904 based on the measurement data.

In accordance of one or more embodiments of the present disclosure, the processor 306 transmits the position control signal to the retractable arm 207 and the rotating mechanism 209 based on the measurement data received from the in-situ measuring device 810. In a non-limiting example, based on the measurement data from the in-situ measuring device 810, the processor 306 determines a location on the substrate 902 (e.g., center area, edge area, and area between the center and the edge areas) where less target material is deposited than intended by a process recipe based on the process specification. Processor 306 transmits the position control signal to control the retractable arm 207 and the rotating mechanism 209 to adjust the location of the magnet member 206 on the target 204. For instance, if the processor 306 determines that there is less target material deposited on the edge of the substrate 902 than intended by the process recipe, the processor 306 transmits the position control signal to extend the retractable arm 207 close to the edge of the target 204. As a result, more of the magnetic field from the magnet member 206 is applied to the edge of the target 204. This increases ion bombardment on the edge of the target 204 and more target material is deposited on the edge of the substrate 902 accordingly.

In other words, a deposition system 100 in accordance with some embodiments described herein can selectively adjust an amount or magnitude of the magnetic field applied to a specific area on the target 204. By increasing the amount of the magnetic field applied to the specific location using the magnet member 206, an ion bombardment on the specific location on the target 204 also increases. The higher or increased ion bombardment means more target material (e.g., metal atoms) are dislodged from the specific location of the target 204. Ultimately, the dislodged material from the specific area of the target 204 is deposited on the corresponding location on the substrate 902, e.g., location on substrate directly beneath the specific area on the target where target material was dislodged.

Output circuitry 308 may be or include one or more output terminals that are communicatively coupled to any desired number of components of the deposition system 100 such as the retractable arm 207 and the rotating mechanism 209. Details of the in-situ measuring device 810 will be provided later in the present disclosure.

Figure 2:
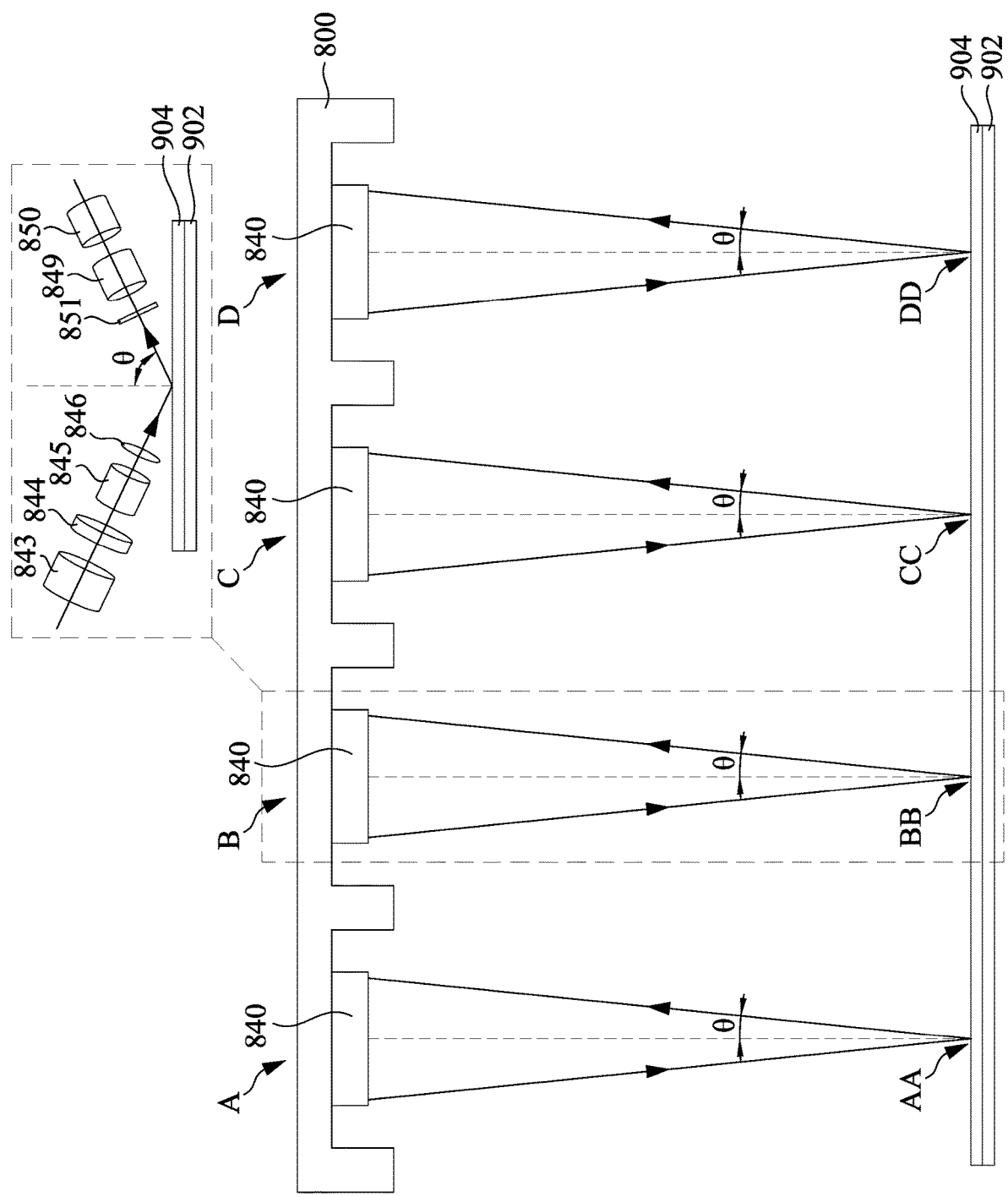
FIG. 2 is a cross-sectional view of a shutter disk 800 along with an in-situ measuring device 810 that includes more than one optical measurement device 840 according one or more embodiments of the present disclosure.

FIG. 2 is a cross-sectional view of the shutter disk 800 along with the in-situ measuring device 810 that includes more than one optical measurement device 840 according one or more embodiments of the present disclosure.

Figure 3:
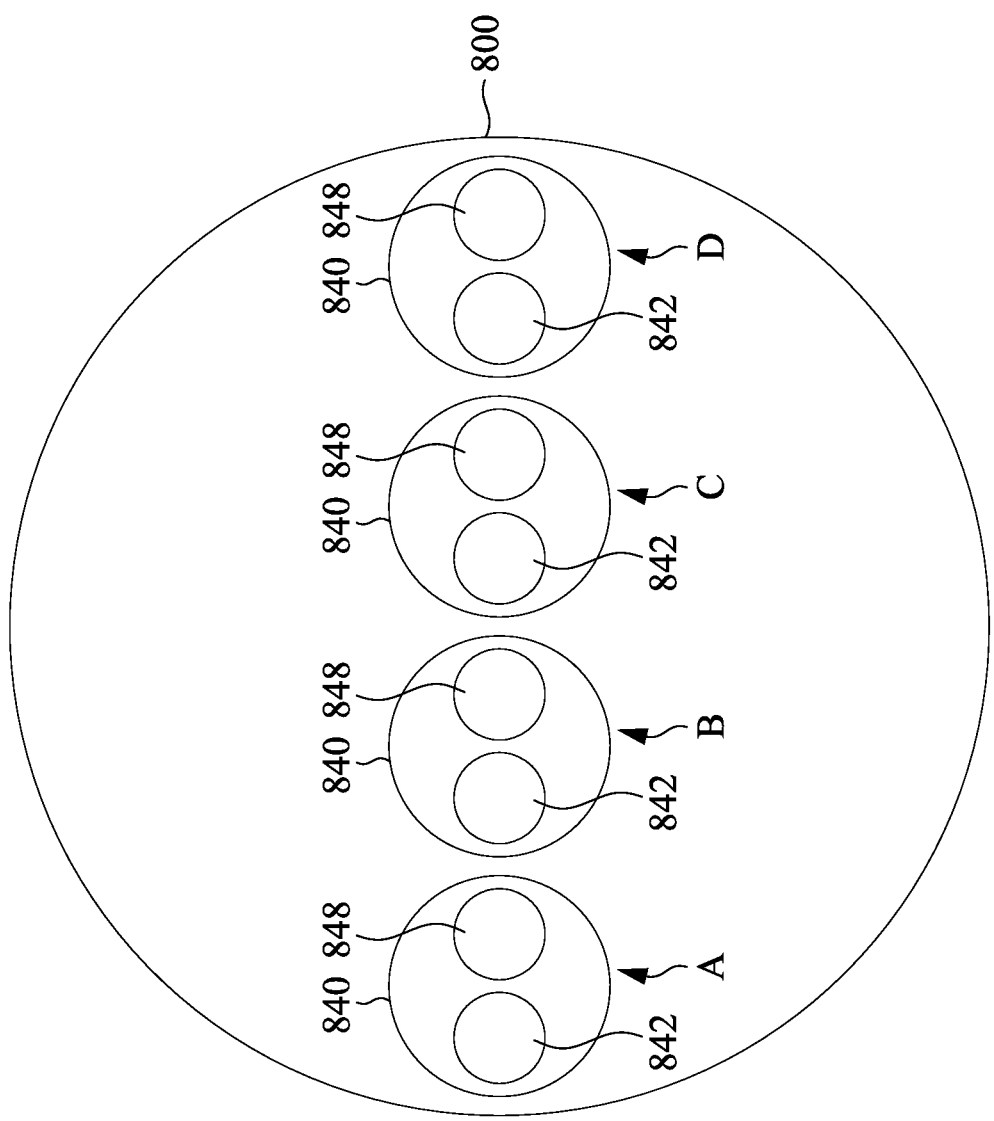
FIG. 3 is a bottom view of the shutter disk 800 along with the in-situ measuring device 810 that includes more than one optical measurement device 840 according one or more embodiments of the present disclosure.

FIG. 3 is a bottom view of the shutter disk 800 along with the in-situ measuring device 810 that includes more than one optical measurement device 840 according one or more embodiments of the present disclosure.

Referring to FIGS. 2 and 3, each of the optical measurement devices 840 includes a light source 842 that is configured to emit a linearly polarized light (e.g., linearly polarized laser) to the thin film 904 on the substrate 902 and a light detector 848 that is configured to detect the light reflected from the thin film 904 (e.g., reflected ellipse) in accordance with one or more embodiments of the present disclosure. Based on the shape of the reflected ellipse and an angle of the reflection θ, the thickness of the thin film 904 on the substrate 902 can be determined.

In the illustrated embodiment in FIGS. 2 and 3, the shutter disk 800 is placed above the substrate 902 at a certain distance to measure the thickness of the thin film 904 on the substrate 902. As discussed above, the optical measurement device 840 includes the light source 842 that is configured to emit the linearly polarized light (e.g., linearly polarized laser) to the thin film 904 on the substrate 902 and a light detector 848 that is configured to detect the light reflected (e.g., reflected ellipse) from the thin film 904. Based on the shape of the reflected ellipse and the angle of the reflection θ, the thickness of the thin film 904 on the substrate 902 is determined. To produce the light that is polarized linearly, the light source 842 includes a laser 843 and a polarizer 845 in accordance with one or more embodiments of the present disclosure. In addition to the laser 843 and the polarizer 845, the light source 842 includes a filter 844 and a quarter wave plate 846 to generate the linearly polarized light from the laser 843 as shown in the illustrated embodiment in FIG. 2. In some embodiments of the present disclosure, the light detector 848, including an analyzer 849 and a detector 850, receives and detects the shape of the reflected ellipse. As discussed above, based on the shape of the reflected ellipse and an angle of the reflection θ, the thickness of the thin film 904 on the substrate 902 is determined.

Referring to FIGS. 2 and 3, the shutter disk 800 includes more than one optical measurement device 840 to measure the thickness of the thin film 904 at the plurality of locations on the substrate 902. In the illustrated embodiment in FIGS. 2 and 3, four optical measurement devices 840 are located on the bottom of the shutter disk 800 to measure the thickness of corresponding locations on the thin film 904. For non-limiting example, the optical measurement device 840 located at location A on the shutter disk 800 is configured to measure the thickness of the thin film 904 at location AA, an optical measurement device 840 located at location B on the shutter disk 800 is configured to measure the thickness of the thin film 904 at location BB, the optical measurement device 840 located at C on the shutter disk 800 is configured to measure the thickness of the thin film 904 at location CC, and the optical measurement device 840 located at location D on the shutter disk 800 is configured to measure the thickness of the thin film 904 at location DD.

In some embodiments, the thickness of the thin film 904 at the locations AA, BB, CC, and DD are taken sequentially in a predetermined order with the corresponding optical measurement devices 840 at respective locations A, B, C, and D.

In some embodiments, to increase the production throughput (e.g., reducing time for the measurement), the thickness of the thin film 904 at AA, BB, CC, and DD are taken simultaneously by the corresponding optical measurement devices 840 at locations A, B, C, and D. To increase accuracy of the thickness measurement by reducing interference due to the simultaneous measurement, each of the corresponding optical measurement devices 840 has the light source 842 that generates the light (e.g., laser beam) with a distinctive wavelength that is different from the others. In a non-limiting example, the light source 842 of the optical measurement device 840 at the location A emits the light with a first wavelength to the location AA on the thin film 904, and the light detector 848 of the optical measurement device 840 at the location A, which is configured to detect the light in the first wavelength, detects the reflected ellipse in the first wavelength from the location AA. In some embodiments of the present disclosure, the light detector 848 of the optical measurement device 840 at the location A includes a light filter 851 to block other light in different wavelengths so only the reflected ellipse in the first wavelength is detected by the light detector 848.

Similar to the light source 842 of the optical measurement device 840 at the location A, the light source 842 of the optical measurement device 840 at the location B emits the light with a second wavelength to the location BB on the thin film 904, and the light detector 848 of the optical measurement device 840 at the location B, which is configured to detect the light in the second wavelength, detects the reflected ellipse in the second wavelength from the location BB. In some embodiments of the present disclosure, the light detector 848 of the optical measurement device 840 at the location B includes a light filter 851 to block other light in different wavelengths so only the reflected ellipse in the second wavelength is detected by the light detector 848.

Similar to the light source 842 of the optical measurement device 840 at the location A, the light source 842 of the optical measurement device 840 at the location C emits the light with a third wavelength to the location CC on the thin film 904, and the light detector 848 of the optical measurement device 840 at the location C, which is configured to detect the light in the third wavelength, detects the reflected ellipse in the third wavelength from the location CC. In some embodiments of the present disclosure, the light detector 848 of the optical measurement device 840 at the location C includes a light filter 851 to block other light in different wavelengths so only the reflected ellipse in the third wavelength is detected by the light detector 848.

Similar to the light source 842 of the optical measurement device 840 at the location A, the light source 842 of the optical measurement device 840 at the location D emits the light with a fourth wavelength to the location DD on the thin film 904, and the light detector 848 of the optical measurement device 840 at the location D, which is configured to detect the light in the fourth wavelength, detects the reflected ellipse in the fourth wavelength from the location DD. In some embodiments of the present disclosure, the light detector 848 of the optical measurement device 840 at the location D includes a light filter 851 to block other light in different wavelengths so only the reflected ellipse in the fourth wavelength is detected by the light detector 848.

In some embodiments of the present disclosure, some of the light generated from the light sources 842 is in the same wavelength if the light sources 842 are spaced apart by a predetermined distance or by a predetermined number of light sources 842. In a non-limiting example, each of the light sources 842 at the locations A and C emits the light in the same wavelength. Similarly, each of the light sources 842 at the locations B and D emits the light in the same wavelength.

In the illustrated embodiments in FIGS. 2 and 3, the shutter disk 800 includes four optical measurement devices 840 to measure the thickness of the thin film 904 on the substrate 902 at the locations AA, BB, CC, and DD that are lined up in one direction. However, the present disclosure does not limit the number of the optical measurement devices 840 included in the in-situ measuring device 810. In a non-limiting example, the in-situ measuring device 810 includes more than four optical measurement devices 840 for a precious uniformity measurement. In some embodiments, the in-situ measuring device 810 includes less than four optical measurement devices 840. In addition, in some embodiments, the optical measurement devices 840 are positioned in a circular pattern (or a partial circular pattern) to measure the thickness of the thin film 904 on the substrate 902 at corresponding locations on the substrate 902. In some embodiments, the optical measurement devices 840 are spread evenly (and/or unevenly) apart from each other. In some embodiments, the optical measurement devices 840 are positioned in any suitable pattern to measure the thickness of the thin film 904 at multiple locations on the substrate 902.

Figure 4:
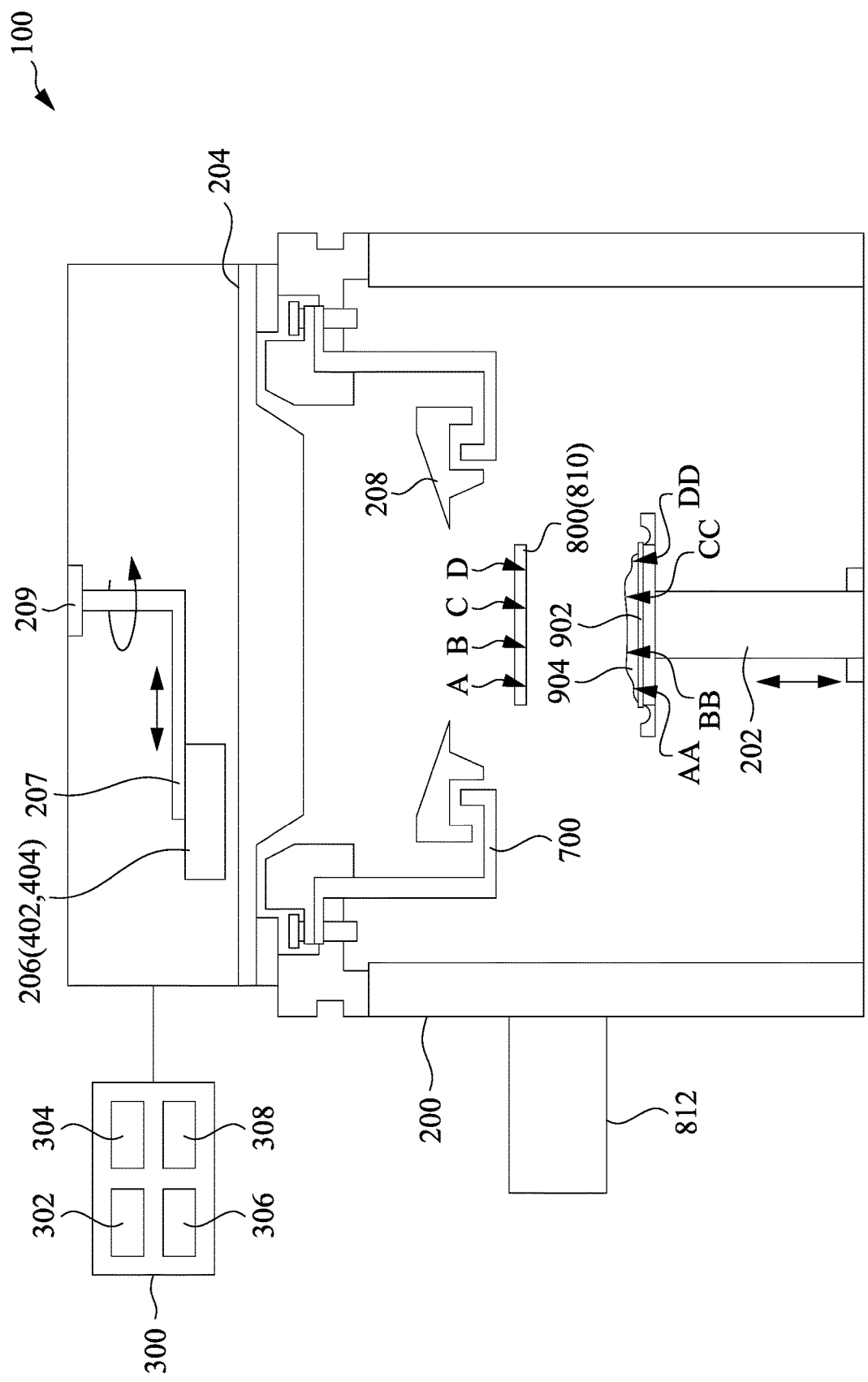
FIG. 4 is a sectional view of the deposition system 100 measuring the thickness of the thin film 904 with the shutter disk 800 according to one or more embodiments in the present disclosure.

FIG. 4 is a sectional view of the deposition system 100 measuring the thickness of the thin film 904 with the shutter disk 800 according to one or more embodiments in the present disclosure.

Referring to FIG. 1, the deposition system 100 deposits the thin film 904 on the substrate 902 by running a process recipe in the illustrated embodiment. The process recipe includes several process conditions, such as deposition time, chamber pressure, and argon gas flowing rate, to deposit the thin film 904 on the substrate 902 within a target range of thickness. In FIG. 1, an illustrated thin film 904 on the substrate 902 does not have a uniform thickness since a thickness of the thin film 904 on the edge of the substrate 902 is less than the target range of the thickness shown in the center area of the thin film 904.

Referring to FIG. 4, after the deposition process shown in FIG. 1, the substrate pedestal 202 that supports the substrate 902 then moves to a measurement positon (e.g., lower position) with the substrate 902 so the substrate 902 is positioned closer to the bottom inner surface of the substrate process chamber 200. While the substrate pedestal 202 is in the measurement position, the shutter disk 800, which is generally stored in the shutter disk storage 812 when it is not in use, is placed above the substrate 902 at a certain distance from the substrate 902 in order to measure at least one of the film characteristics (e.g., thickness, resistance, and composition) from the thin film 904 on the substrate 902.

In the illustrated embodiment in FIG. 4, the shutter disk 800 is positioned above the substrate 902 for the thickness measurement of the thin film 904 at the plurality of locations (e.g., AA, BB, CC, and DD) on the substrate 902. In the illustrated embodiment in FIG. 4, the in-situ measuring device 810 on the shutter disk 800 includes the plurality of optical measurement devices 840 illustrated in FIGS. 2 and 3. As discussed above, the thickness of the thin film 904 at locations AA, BB, CC, and DD is measured sequentially in a predetermined order or simultaneously with the corresponding optical measurement devices 840 at respective locations A, B, C, and D.

As discussed above, the present disclosure does not limit the number of the optical measurement devices 840 in the in-situ measuring device 810. Accordingly, in some embodiments of the present disclose, the in-situ measuring device 810 includes less than four optical measurement devices 840 or more than four optical measurement devices 840. For example, the shutter disk 800 can include 1, 2, 3, 5, 6, 7, or more optical measurement devices 840.

In some embodiments of the present disclosure, the shutter disk 800 can include 128 optical measurement devices 840 to measure the thickness of the thin film 904 at 128 locations corresponding to the 128 optical measurement devices 840.

Figure 5:
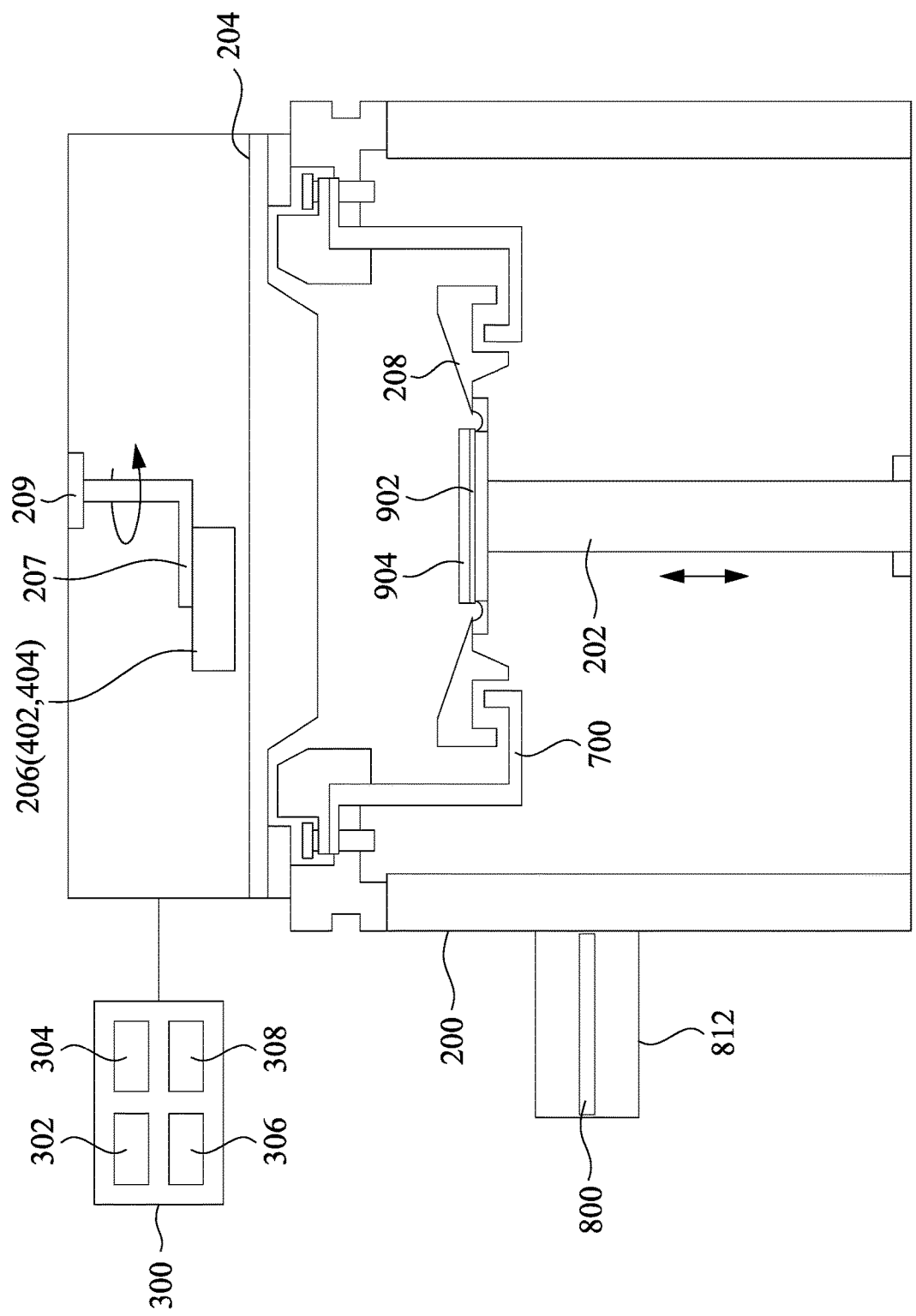
FIG. 5 is a sectional view illustrating an exemplary result of the deposition system 100 after a second deposition (e.g., re-deposition) according to one or more embodiments of the present disclosure.

As discussed above, thickness uniformity of the thin film 904 can be measured based on the thickness measurements using the optical measurement devices 840. FIG. 5 is a sectional view illustrating an exemplary result of the deposition system 100 after a second deposition (e.g., re-deposition) according to one or more embodiments of the present disclosure.

Referring to FIG. 5, the controller 300 of the deposition system 100 receives the thickness measurement data from the in-situ measuring device 810. Based on the measurement data, the controller 300 determines one or more locations where the thickness of the thin film 904 on the substrate 902 is less than the target range of the thickness. In the example illustrated in FIG. 5, the controller 300 determines that the thin film 904 on the edge of the substrate 902 has a thickness less than the target range of thickness. Based on the determined location on the substrate 902, the controller 300 adjusts the magnetic field generated by the magnet member 206 using any combination of the methods described below to increase the ion bombardment on a surface of the target 204 that is above or directly above from the determined location on the substrate 902 for the second deposition. For example, in one or more embodiments of the present disclosure, the controller 300 transmits the position control signal to the retractable arm 207 and the rotating mechanism 209 to adjust the location of the magnet member 206 on the target 204 to increase the ion bombardment on the surface of the target 204 that is above or directly above the determined location on the substrate 902. In some embodiments of the present disclosure, in addition to transmitting the position control signal which controls the location of the magnet member 206, if the magnet member 206 includes the electromagnet member 404, the controller 300 supplies more current to the magnet member 206 to increase the ion bombardment on the surface of the target 204 that is above or directly above the determined location on the substrate 902 (e.g., transmitting the current control signal). In other words, the controller 300 adjusts the magnetic field using any combination of the methods described above based on measurement data collected from the in-situ measuring device 810 for the second deposition on the substrate 902.

As shown in FIG. 5, in the deposition system 100 according to one or more embodiments of the present disclosure, the controller 300 transmits the position control signal to the retractable arm 207 and the rotating mechanism 209 to increase the ion bombardment on the edge of the target 204 by directing more magnetic field to the edge of the target 204 based on measurement from the in-situ measuring device 810. As a result, uniformity of the thin film 904 on the substrate 902 increases by re-depositing more target material on the edge of the substrate 902.

One of the advantages of having the in-situ measuring device 810, which is capable of measuring at least one of the film characteristics (e.g., thickness, resistance, and composition) in the deposition system 100, is having a capability of monitoring and/or verifying the result of the deposition process without transferring the substrate 902 to a metrology tool. With the capability of monitoring and/or verifying the result in the same chamber, less defective substrates are produced by the deposition system 100. For example, in some embodiments of the present disclosure, based on the measurement by the in-situ measuring device 810, the controller 300 of the deposition system 100 is able to adjust the location of magnet member 206 for the second deposition (or additional deposition) to improve the thickness uniformity while the substrate 902 is still in the substrate process chamber 200. In some embodiments, based on the measurement data collected by the in-situ monitoring device 810 in the deposition system 100, the deposition system 100 is set to be offline from production for hardware tuning or process tuning early on before producing additional substrates with defects (e.g., thickness defect, resistance defect, and composition defect).

In some embodiments of the present disclosure, the controller 300 receives the thickness measurement from the in-situ measuring device 810. Based on the measurement, the controller 300 determines an average thickness of the thin film 904 on the substrate 902. Controller 300 determines one or more locations where the thickness of the thin film 904 is less than the determined average thickness. Based on the determined locations on the substrate 902, the controller 300 adjusts the magnetic field to increase the ion bombardment on the surface of the target 204 which is above or directly above the determined locations.

As discussed above, the controller 300 is capable of transmitting the position control signal to the retractable arm 207 and the rotating mechanism 209 to adjust the location of the magnet member 206 on the target 204 to increase the ion bombardment on the surface of the target 204 that is likely to affect the thin film thickness at the determined locations. In some embodiments of the present disclosure, in addition to transmitting the position control signal which controls the location of the magnet member 206, if the magnet member 206 includes the electromagnet member 404, the controller 300 is capable of supplying more current to the magnet member 206 to increase the ion bombardment on the surface of the target 204 that is likely affect the thin film thickness at the determined locations.

One of the advantages of having the controller 300, which is capable of controlling the uniformity of the thin film 904 on the substrate 902 based on the determined average thickness of the thin film 904, is saving time and cost to form the uniform thin film 904 on the substrate 902.

Figure 6:
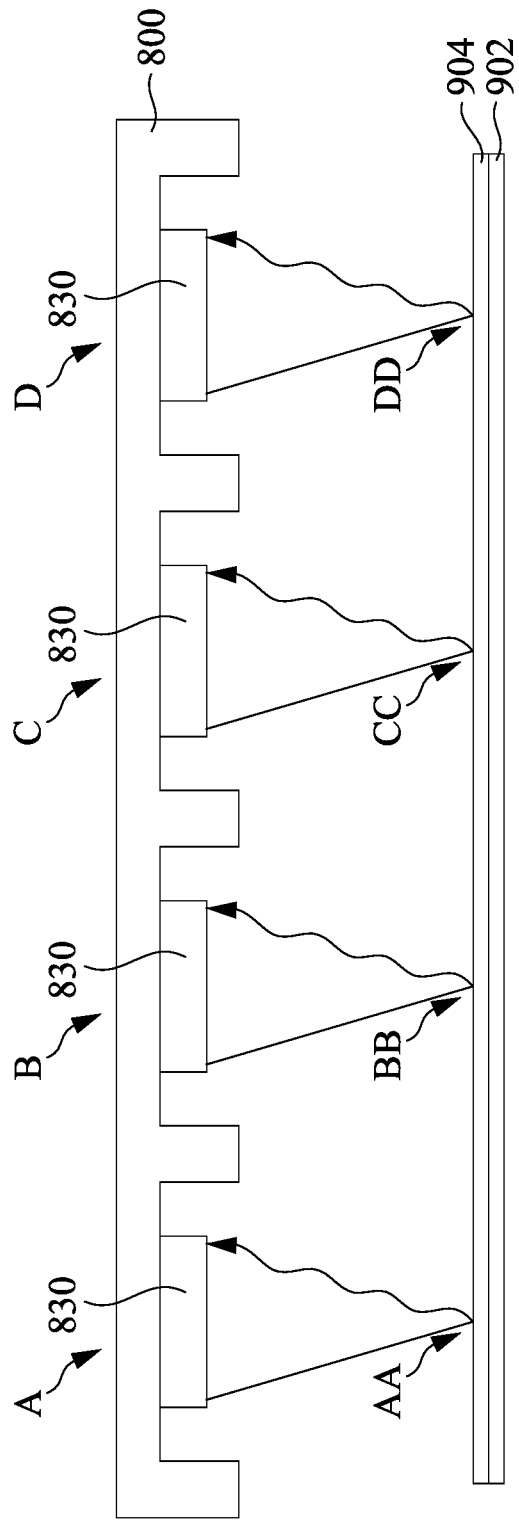
FIG. 6 is a cross-sectional view of the shutter disk 800 along with the in-situ measuring device 810 that includes more than one x-ray measurement device 830 according one or more embodiments of the present disclosure.

FIG. 6 is a cross-sectional view of the shutter disk 800 along with the in-situ measuring device 810 that includes more than one x-ray measurement device 830 according one or more embodiments of the present disclosure.

Figure 7:
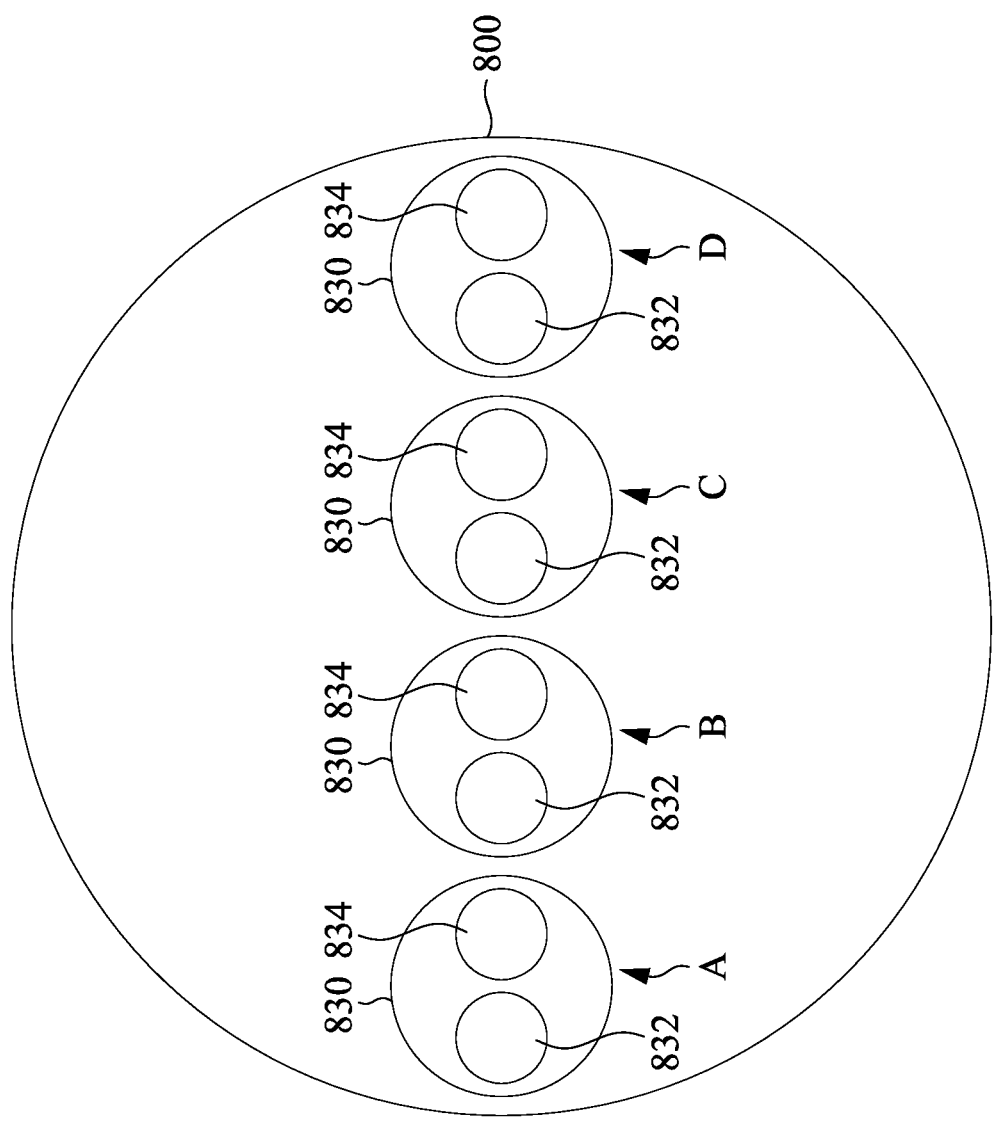
FIG. 7 is a bottom view of the shutter disk 800 along with the in-situ measuring device 810 that includes more than one x-ray measurement device 830 according one or more embodiments of the present disclosure.

FIG. 7 is a bottom view of the shutter disk 800 along with the in-situ measuring device 810 that includes more than one x-ray measurement device 830 according one or more embodiments of the present disclosure.

Referring to FIGS. 6 and 7, each of the x-ray measurement devices 830 includes at least one x-ray source 832 that is configured to emit x-ray to the thin film 904 on the substrate 902 and at least one corresponding x-ray detector 834 that is configured to detect fluorescence (and/or other material) released from the thin film 904 caused by the x-ray emitted to the thin film 904 on the substrate 902. The composition of the thin film 904 on the substrate 902 can be determined based on the energy represented by the detected fluorescence (and/or other material).

In the illustrated embodiment in FIGS. 6 and 7, the shutter disk 800 is placed above the substrate 902 at a certain distance to measure the composition of the thin film 904 on the substrate 902. As discussed above, the x-ray measurement device 830 includes the x-ray source 832 that is configured to emit the x-ray to the thin film 904 on the substrate 902 and x-ray detector 834 that is configured to detect the fluorescence (and/or other material) released from the thin film 904. Based on the energy represented by the detected fluorescence (and/or other material), the composition of the thin film 904 on the substrate 902 is determined.

Referring to FIGS. 6 and 7, the shutter disk 800 includes more than one x-ray measurement device 830 to measure the composition of the thin film 904 at the plurality of locations on the substrate 902. In the illustrated embodiment in FIGS. 6 and 7, four x-ray measurement devices 830 are located on the bottom of the shutter disk 800 to measure the composition of corresponding locations on the thin film 904. In a non-limiting example, the x-ray measurement device 830 located at location A on the shutter disk 800 is configured to measure the composition of the thin film 904 at location AA, an x-ray measurement device 830 located at location B on the shutter disk 800 is configured to measure the composition of the thin film 904 at location BB, the x-ray measurement device 830 located at C on the shutter disk 800 is configured to measure the composition of the thin film 904 at location CC, and the x-ray measurement device 830 located at location D on the shutter disk 800 is configured to measure the composition of the thin film 904 at location DD.

In some embodiments, the composition of the thin film 904 at locations AA, BB, CC, and DD is taken sequentially in a predetermined order with the corresponding x-ray measurement devices 830 at respective locations A, B, C, and D. In some embodiments, the composition of the thin film 904 at locations AA, BB, CC, and DD is taken simultaneously with the corresponding x-ray measurement devices 830 at respective locations A, B, C, and D.

Referring to FIG. 6, the controller 300 of the deposition system 100 receives the composition measurement data from the in-situ measuring device 810. Based on the measurement data, the controller 300 determines an average of the composition of the thin film 904 on the substrate 902 (e.g., titanium/nitride ratio). In an event, the average composition ratio is not within the composition ratio range required by the process specification, the controller 300 generates and transmits the warning signal for alarming the defect in the thin film 904 based on the average composition ratio. In a non-limiting example, if the thin film 904 is formed with materials from Titanium (Ti) target and Nitrogen ($N_2$) reactive gas in a reactive sputtering process, the controller 300 of the deposition system 100 determines an average titanium/nitride ratio for the thin film 904 based on the measurements from the in-situ measuring device 810. When the controller 300 determines that the average titanium/nitride ratio is not within the composition ratio required by the process specification, the controller 300 transmits the warning signal to the operator or a controller of the AMHS. Accordingly, the deposition system 100 is set to be offline from production so necessary hardware tuning (e.g., re-calibrate and/or replace mass flow controllers for the reactive and inert gases such as Nitrogen and Argon) or process tuning (adjusting values that control the mass flow controllers in the process recipe) can be performed early on before producing additional substrates with composition defects. The present disclosure does not limit the number of the x-ray measurement device 830 in the in-situ measuring device 810. Accordingly, in some embodiments of the present disclose, the in-situ measuring device 810 includes less than four x-ray measurement devices 830 or more than four x-ray measurement devices 830. For example, the shutter disk 800 can include 1, 2, 3, 5, 6, 7, or more x-ray measurement devices 830.

In addition, in some embodiments, the x-ray measurement devices 830 are positioned in a circular pattern (or a partial circular pattern) to measure the composition of the thin film 904 at corresponding of locations on the substrate 902. In some embodiments, the x-ray measurement devices 830 are spread evenly (and/or unevenly) apart from each other. In some embodiments, the x-ray measurement devices 830 are positioned in any suitable pattern to measure the composition of the thin film 904 at multiple locations on the substrate 902.

As discussed above, one of the advantages of having the in-situ measuring device 810, which is capable of measuring the film composition in the deposition system 100, is having a capability of monitoring and/or verifying the result of the deposition process without transferring the substrate 902 to a metrology tool. In other words, the fabrication operator can respond to the composition ratio defects early on to save cost of production by identifying and correcting problems with the deposition system 100.

Figure 8:
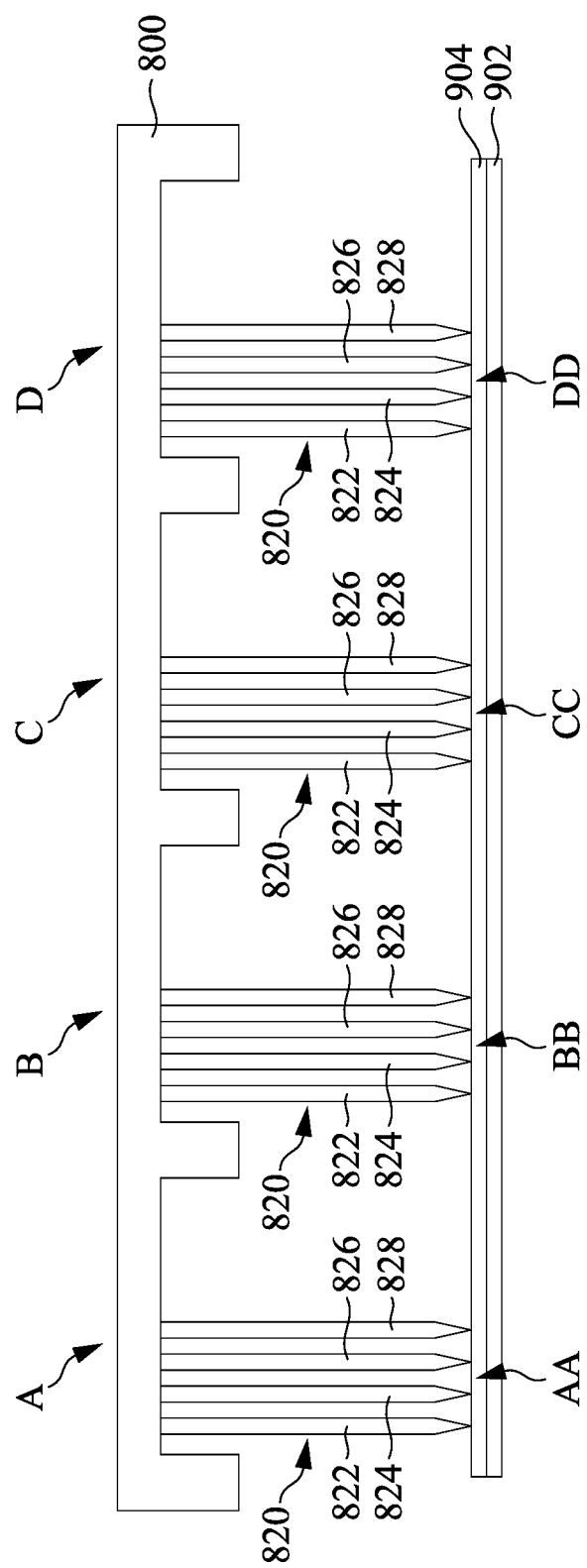
FIG. 8 is a cross-sectional view of the shutter disk 800 along with the in-situ measuring device 810 that includes more than one resistivity measurement device 820 according one or more embodiments of the present disclosure.

FIG. 8 is a cross-sectional view of the shutter disk 800 along with the in-situ measuring device 810 that includes more than one resistivity measurement device 820 that is in a measuring position according one or more embodiments of the present disclosure.

Figure 9:
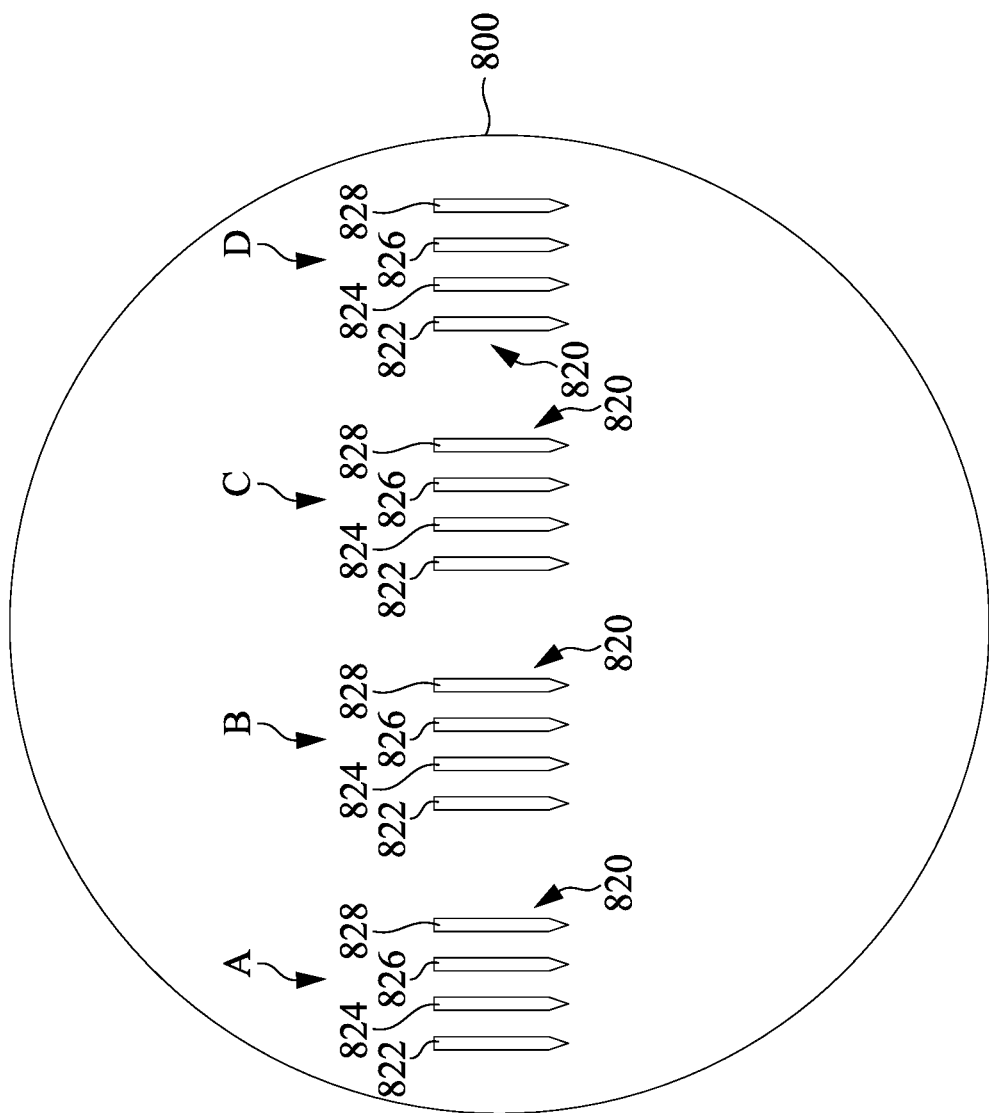
FIG. 9 is a bottom view of the shutter disk 800 along with the in-situ measuring device 810 that includes more than one resistivity measurement device 820 according one or more embodiments of the present disclosure.

FIG. 9 is a bottom view of the shutter disk 800 along with the in-situ measuring device 810 that includes more than one resistivity measurement device 820 that is in a folding position according one or more embodiments of the present disclosure.

Referring to FIGS. 8 and 9, each of the resistivity measurement devices 820 (e.g., four-point probe) includes four in-line probes 822, 824, 826, and 828 that are equally spaced apart from each other. All of the in-line probes 822, 824, 826, and 828, arranged in a single file configuration and are configured to contact a surface of the thin film 904 while the sheet resistance is being measured. The two outer probes 822 and 824 are coupled to a current source that is passed between the outer probes 822 and 824. A potential difference between the two inner probes 826 and 828 is measured. Based on the spacing (s) between the probes 822, 824, 826, and 828, the current (I) that passed between the outer probes 822 and 824, and the potential difference (V) between the two inner probe 826 and 828, the sheet resistance is calculated using Equation 1.

$$\text{Sheet Resistance of the thin film } 904 = \frac{V}{I} \times 2\pi s \quad \text{Equation 1}$$

In the illustrated embodiment in FIGS. 8 and 9, the shutter disk 800 is placed above the substrate 902 at a certain distance to measure the sheet resistance of the thin film 904 on the substrate 902. As discussed above, the resistivity measurement device 820 includes the four in-line probes 822, 824, 826, and 828 that are equally spaced apart from each other. In the illustrated embodiment in FIGS. 8 and 9, when the four in-line probes 822, 824, 826, and 828 are in use to measure the sheet resistance, the four in-line probes 822, 824, 826, and 828 are unfolded to contact the surface of the thin film 904.

Referring to FIGS. 8 and 9, the shutter disk 800 includes more than one resistivity measurement device 820 to measure the sheet resistance of the thin film 904 at the plurality of locations on the substrate 902. In the illustrated embodiment in FIGS. 8 and 9, four resistivity measurement devices 820 are located on the bottom of the shutter disk 800 to measure the sheet resistance of corresponding portions of the thin film 904. In a non-limiting example, the resistivity measurement device 820 located at location A on the shutter disk 800 is configured to measure the sheet resistance of the thin film 904 at location AA, the resistivity measurement device 820 located at location B on the shutter disk 800 is configured to measure the sheet resistance of the thin film 904 at location BB, the resistivity measurement device 820 located at C on the shutter disk 800 is configured to measure the sheet resistance of the thin film 904 at location CC, and the resistivity measurement device 820 located at location D on the shutter disk 800 is configured to measure the sheet resistance of the thin film 904 at location DD.

In some embodiments, the sheet resistance of the thin film 904 at locations AA, BB, CC, and DD is taken sequentially in a predetermined order with the corresponding resistivity measurement devices 820 at respective locations A, B, C, and D. In some embodiments, the sheet resistance of the thin film 904 at locations AA, BB, CC, and DD is taken simultaneously with the corresponding resistivity measurement devices 820 at respective locations A, B, C, and D.

Referring to FIG. 8, the controller 300 of the deposition system 100 receives the sheet resistance measurement data from the in-situ measuring device 810. Based on the measurement data, the controller 300 determines an average of the sheet resistance of the thin film 904 on the substrate 902. When the controller 300 determines that the average sheet resistance is not within the sheet resistance range required by the process specification, the controller 300 generates and transmits the warning signal for alarming the defect in the thin film 904 based on the average sheet resistance measurement. Accordingly, the deposition system 100 is set to be offline from production so necessary hardware tuning or process tuning can be performed early on before producing additional substrates with sheet resistance defects.

The present disclosure does not limit the number of the resistivity measurement devices 820 in the in-situ measuring device 810. Accordingly, in some embodiments of the present disclosure, the in-situ measuring device 810 includes less than four resistivity measurement devices 820 or more than four resistivity measurement devices 820. For example, the shutter disk 800 can include 1, 2, 3, 5, 6, 7, or more resistivity measurement devices 820.

Due to scratching concerns on the surface of the substrate 902, in some embodiments, the number of the resistivity measurement devices 820 in the shutter disk 800 can be minimized (e.g., reduced to one or few).

However, in some embodiments, the measurement devices 820 are positioned based on testing spots on the substrate 902 (e.g., locations purposely reserved for in-contact measurements) to reduce the scratching concerns. In other words, in some embodiments, each of the resistivity measurement devices 820 is positioned on the shutter disk 800 so the four in-line probes 822, 824, 826, and 828 of each resistivity measurement devices 820 are configured to touch the testing spots on the substrate 902 during the measurement.

In addition, in some embodiments, the resistivity measurement devices 820 are positioned in a circular pattern (or a partial circular pattern) to measure the sheet resistance of the thin film 904 at corresponding of locations on the substrate 902. In some embodiments, the resistivity measurement devices 820 are spread evenly (and/or unevenly) apart from each other. In some embodiments, the resistivity measurement devices 820 are positioned in any suitable pattern to measure the sheet resistance of the thin film 904 at multiple locations on the substrate 902.

As discussed above, one of the advantages of having the in-situ measuring device 810, which is capable of measuring the film sheet resistance in the deposition system 100, is having a capability of monitoring and/or verifying the result of the deposition process without transferring the substrate 902 to a metrology tool. In other words, the fabrication operator can respond to the sheet resistance defects early on to save cost of production by identifying and correcting problems with the deposition system 100.

Figure 10:
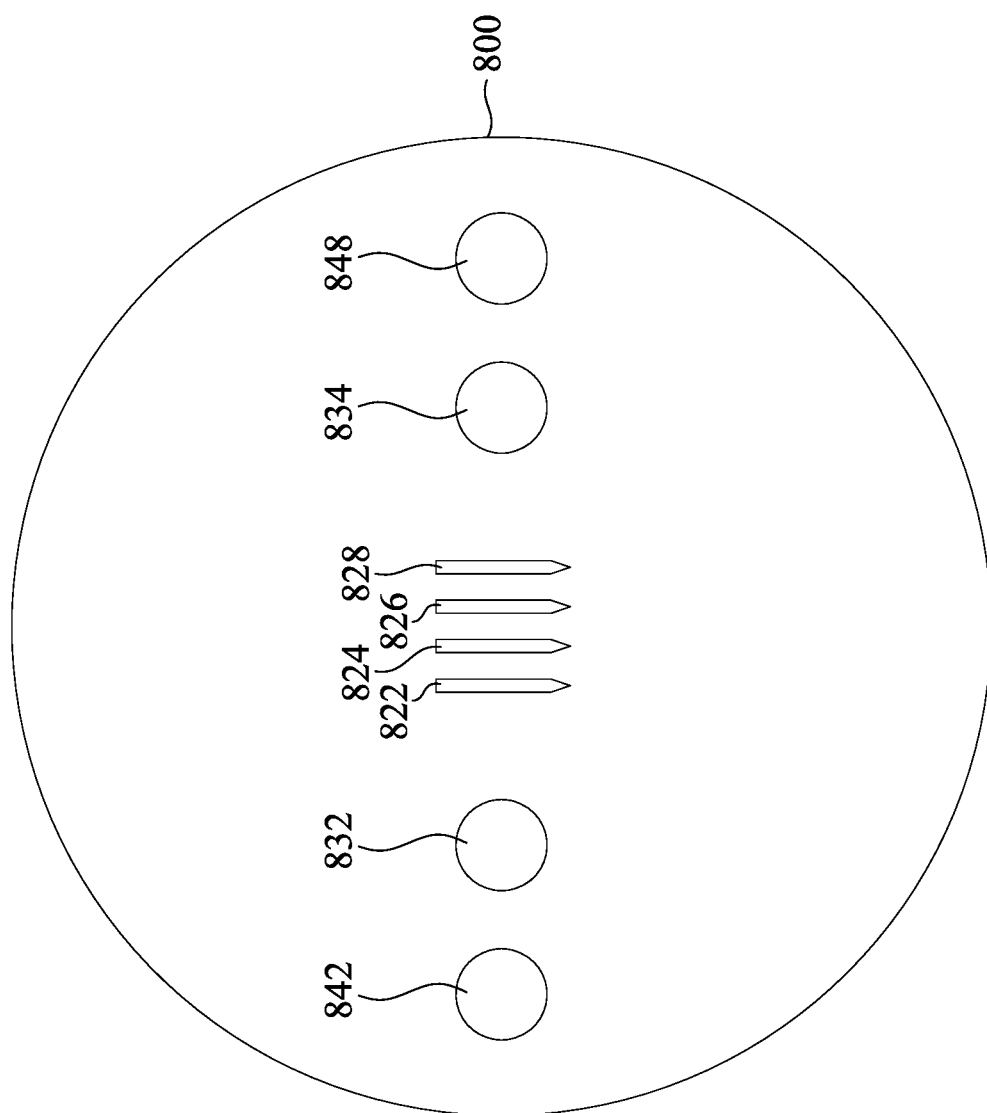
FIG. 10 is a bottom view of the shutter disk 800 along with the in-situ measuring device 810 that includes one resistivity measurement device 820, one x-ray measurement device 830, and one optical measurement device 840 according to one or more embodiments of the present disclosure.

FIG. 10 is a bottom view of the shutter disk 800 along with the in-situ measuring device 810 that includes one resistivity measurement device 820, one x-ray measurement device 830, and one optical measurement device 840 according to one or more embodiments of the present disclosure.

As discussed above, the resistivity measurement device 820 includes four in-line probes 822, 824, 826, and 828 that are equally spaced apart from each other. All of the in-line probes 822, 824, 826, and 828, arranged in a single file, are configured to contact with a surface of the thin film 904 while the sheet resistance is being measured. X-ray measurement device 830 includes at least one x-ray source 832 that is configured to emit x-ray to the thin film 904 and at least one corresponding x-ray detector 834 that is configured to detect fluorescence (and/or other material) released from the thin film 904 caused by the x-ray emitted to the thin film 904. Optical measurement device 840 includes a light source 842 that is configured to emit a linearly polarized light (e.g., linearly polarized laser) to the thin film 904 on the substrate 902 and a light detector 848 that is configured to detect the light reflected from the thin film 904 (e.g., reflected ellipse).

Figure 11:
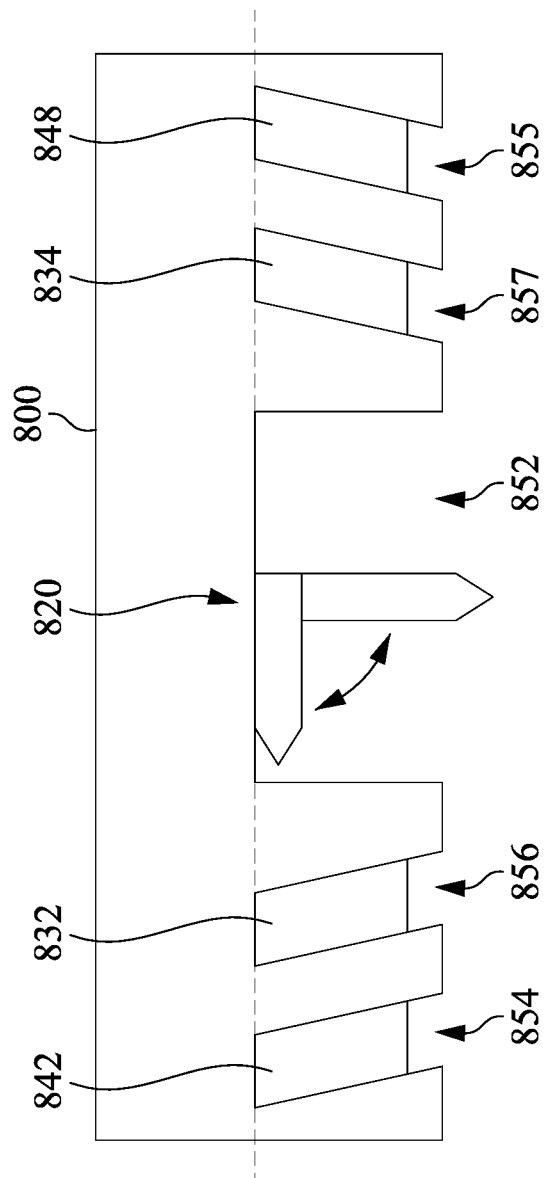
FIG. 11 is a cross-sectional view of the shutter disk 800 along with the in-situ measuring device 810 that includes one resistivity measurement device 820, one x-ray measurement device 830, and one optical measurement device 840 according to one or more embodiments of the present disclosure.

FIG. 11 is a cross-sectional view of the shutter disk 800 along with the in-situ measuring device 810 that includes one resistivity measurement device 820, one x-ray measurement device 830, and one optical measurement device 840 according to one or more embodiments of the present disclosure.

In the illustrated embodiment in FIG. 11, the shutter disk 800 includes a plurality of cavities 852, 854, 855, 856, and 857 formed on the bottom of the shutter disk 800. First cavity 852 provides a space where the resistivity measurement device 820 is stored when the resistivity measurement device 820 is not in use. As illustrated in FIG. 11, when the resistivity measurement device 820 is not being used (e.g., when another measurement device is being used or when the shutter disk 800 is being used to cover the top surface of the substrate pedestal 202 for chamber cleaning and/or conditioning), each of the four in-line probes 822, 824, 826, and 828 is folded into the first cavity 852.

As illustrated in FIG. 11, the light source 842 is located in the second cavity 854 and the light detector 848 is located in the third cavity 855. In some embodiments, the light source 842 include the laser 843, the filter 844, the polarizer 845, and the quarter wave plate 846 to generate the light (e.g., laser light) that is polarized linearly. In some embodiments, the light detector 848 includes a light analyzer 849 and a detector 850 to determine the thinness of the thin film 904 on the substrate 902.

In some embodiments, the second cavity 854 provides a space on the bottom of the shutter disk 800 so the light source 842 can be located on the bottom without being protruded on the surface. This provides a planar bottom surface for the shutter disk 800 where the bottom surface meets with the top surface of substrate pedestal 202 during the chamber cleaning and/or conditioning processes which are discussed above.

In some embodiments, the second cavity 854 forms at an angle between 0° and 90° with respect to a virtual horizontal line that is parallel with the top surface of the shutter disk 800. As illustrated in FIG. 11, the second cavity 854 that is formed at the angle allows the light source 842 to emit the light toward the thin film 904 at a certain angle.

In some embodiments, the third cavity 855 provides a space on the bottom of the shutter disk 800 so the light detector 848 can be located on the bottom without being protruded on the surface. This provides the planar bottom surface for the shutter disk 800 where the bottom surface meets with the top surface of substrate pedestal 202 during the chamber cleaning and/or conditioning processes which are discussed above.

In some embodiments, the third cavity 855 forms at an angle between 0° and 90° with respect to a virtual horizontal line that is parallel with the top surface of the shutter disk 800. As illustrated in FIG. 11, the third cavity 855 that is formed at the angle allows the light detector 848 to detect and/or analyze the light reflected from the thin film 904.

In some embodiments, the fourth cavity 856 provides a space on the bottom of the shutter disk 800 so the x-ray source 832 can be located on the bottom without being protruded on the surface. This provides the planar bottom surface for the shutter disk 800 where the bottom surface meets with the top surface of substrate pedestal 202 during the chamber cleaning and/or conditioning processes which are discussed above.

In some embodiments, the fourth cavity 856 forms at an angle between 0° and 90° with respect to a virtual horizontal line that is parallel with the top surface of the shutter disk 800. As illustrated in FIG. 11, the fourth cavity 856 that is formed at the angle allows the x-ray source 832 to irradiate the x-ray toward the thin film 904 at a certain angle.

In some embodiments, the fifth cavity 857 provides a space on the bottom of the shutter disk 800 so the x-ray detector 834 can be located on the bottom without being protruded on the surface. This provides the planar bottom surface for the shutter disk 800 where the bottom surface meets with the top surface of substrate pedestal 202 during the chamber cleaning and/or conditioning processes which are discussed above.

In some embodiments, the fifth cavity 857 forms at an angle between 0° and 90° with respect to a virtual horizontal line that is parallel with the top surface of the shutter disk 800. As illustrated in FIG. 11, the fifth cavity 857 that is formed at the angle allows the x-ray detector 834 to detect and/or analyze fluorescence (and/or other material) released from the thin film 904 caused by the x-ray emitted to the thin film 904. As discussed above, the composition of the layer can be determined based on the energy represented by the detected fluorescence (and/or other material).

Referring to FIG. 11, the controller 300 of the deposition system 100 receives the sheet resistance measurement data, the thickness measurement data, and the composition data from the in-situ measuring device 810.

In some embodiments of the present disclosure, when the controller 300 determines that the thickness of the thin film 904 is less than the thickness required by the process specification, the controller 300 generates and transmits a signal for an additional deposition. In some embodiments, when the controller 300 determines that the thickness of the thin film 904 is more than the thickness required by the process specification, the controller 300 generates and transmits the warning signal for hardware tuning or process tuning.

In some embodiments of the present disclosure, when the controller 300 determines that the composition of the thin film 904 (e.g., composition ratio) does not meet the composition ratio required by the process specification, the controller 300 generates and transmits the warning signal for hardware tuning or process tuning.

In some embodiments of the present disclosure, when the controller 300 determines that sheet resistance of the thin film 904 is not within the sheet resistance range required by the process specification, the controller 300 generates and transmits the warning signal for hardware tuning or process tuning.

As discussed above, one of the advantages of having the in-situ measuring device 810, which is capable of measuring the film characteristics in the deposition system 100, is having a capability of monitoring and/or verifying the result of the deposition process without transferring the substrate 902 to the metrology tool. In other words, the fabrication operator can respond to the defects early on to save cost of production by identifying and correcting problems with the deposition system 100.

Figure 12:
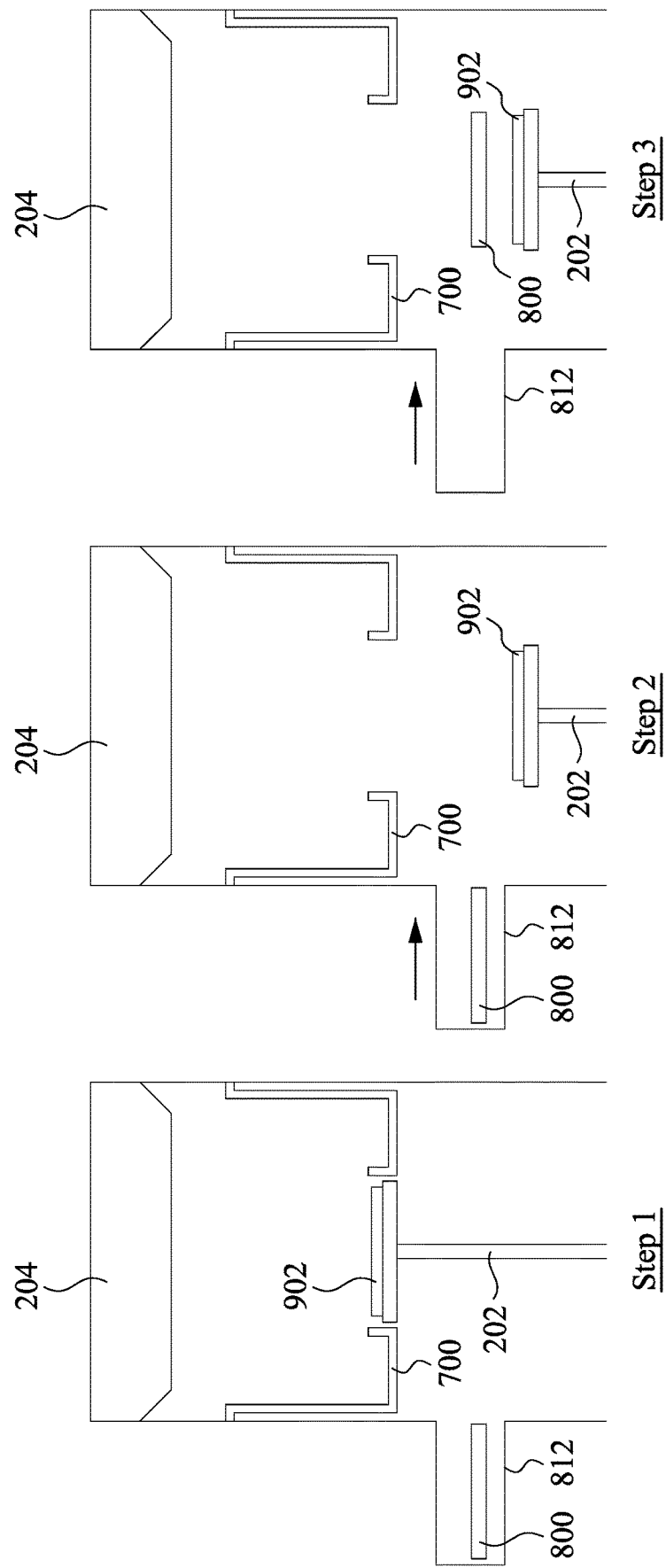
FIG. 12 is a diagram illustrating movement of the shutter disk 800 in FIG. 11 from a storage position (standby position) to a measurement position.

FIG. 12 is a diagram illustrating movement of the shutter disk 800 in FIG. 11 from a storage position (standby position) to a measurement position.

Referring to Step 1 of FIG. 12 illustrates that the substrate pedestal 202 is the upper position supporting the substrate 902 during a sputtering process. At this time, the thin film 904 is formed with material from the target 204 (and reactive gas supplied to the substrate process chamber 200) on the substrate 902. During the sputtering process, the shutter disk 800 with the in-situ measuring device 810 is stored in the shutter disk storage 812.

Referring to Step 2 of FIG. 12, Step 2 illustrates that the substrate pedestal 202 that supports the substrate 902 moves to the lower position with the substrate 902 so the substrate 902 is positioned closer to the bottom inner surface of the substrate process chamber 200.

Referring to Step 3 of FIG. 12, Step 3 illustrates that a shutter disk arm or a robot arm (not shown) is used to move the shutter disk 800 from the shutter disk storage 812 to the measurement position (position above the substrate 902). As described above, in various embodiments of the present disclosure, the controller 300 of the deposition system 100 receives the sheet resistance measurement data, the thickness measurement data, and the composition data from the in-situ measuring device 810.

The movement of the shutter disk 800 illustrated in FIG. 12 is not limited to the shutter disk 800 in FIG. 11. The same movement of the shutter disk 800 can be used with other shutter disks 800 configured with different in-situ measuring device 810.

Figure 13:
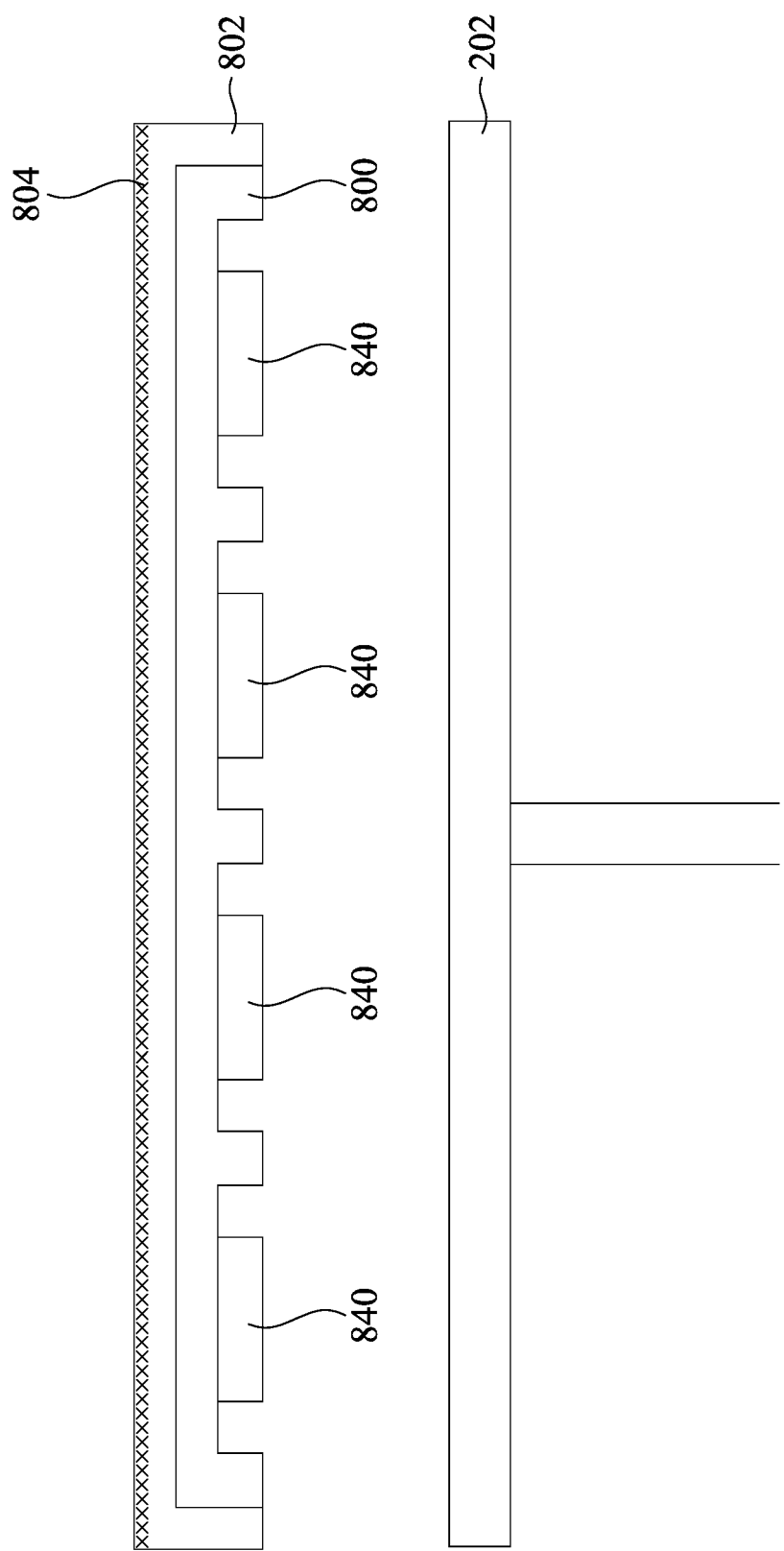
FIG. 13 is a cross-sectional view of the shutter disk 800 along with a detachable cover 802 according to one or more embodiments of the present disclosure.

FIG. 13 is a cross-sectional view of the shutter disk 800 along with a detachable cover 802 according to one or more embodiments of the present disclosure.

In the illustrated embodiment in FIG. 13, the shutter disk 800 includes the detachable cover 802. In some embodiments of the present disclosure, the detachable cover 802 is made with or coated with the same material that the substrate process chamber 200 is intended to deposit on the substrate 902. In a non-limiting example, the detachable cover 802 is coated with titanium nitride for the substrate process chamber 200 that deposits titanium nitride thin film on the substrate 902.

As discussed above, to prevent the target material (e.g., target material reacting with the reactive gas) on the surfaces of the substrate process chamber 200 from re-depositing on the substrate 902 in the substrate process chamber 200, the deposition system 100 is programmed to run a periodic chamber conditioning recipe that is intended to form a coating layer that covers the target material on these surfaces so the target material on these surfaces stays on the surfaces until a process shield 700 and a cover ring 208 are replaced based on a periodic maintenance procedure. Shutter disk 800 is used to cover the substrate pedestal 202 during this chamber conditioning process to isolate the substrate pedestal 202 (which is in a process positon) from the material used to form the coating layer and prevent the coating layer from forming on the substrate pedestal 202. By having the detachable cover 802 made with or coated with the same material as the target material, the coating layer deposited on the detachable cover 802 is more likely to bond well with the surface of the detachable cover 802 regardless of temperature change. Having a good bonding between the detachable cover 802 and the coating layer is beneficial when it comes to preventing the coating layer from peeling and re-depositing onto the substrate 902. For example, the detachable cover 802 made with or coated with the same material as the target material (or material that is intended to deposit on the substrate 902) is likely to bond well with the coating layer deposited on the detachable cover 802 during the periodic chamber conditioning process since both the detachable cover 802 and the coating layer expand and shrink at the same rate. This prevents the coating layer peeling from the detachable cover 802 which is subject to undergo sudden changes in temperature.

As illustrated in FIG. 13, each of the detachable cover 802 and the shutter disk 800 has a diameter greater than a diameter of the top surface of the substrate pedestal 202 to protect the edge of the top surface of the substrate pedestal 202 from being etched during the cleaning process. In some embodiments, the detachable cover 802 has a diameter greater than a diameter of the top surface of the substrate pedestal 202. It is beneficial to protect the top surface of the substrate pedestal 202 from the plasma created during the cleaning process, so the substrate 902 can be placed evenly on the substrate pedestal 202 without damaging the bottom surface of the substrate 902.

In some embodiments, the detachable cover 802 and the shutter disk 800 are configured to fit with a deposition ring (not shown) which cover the edge of the top surface of the substrate pedestal 202 (e.g., detachable cover 802 and the shutter disk 800 having a diameter smaller than a diameter of an inner ring of the deposition ring).

In some embodiments of the present disclosure, the detachable cover 802 includes a texturized surface 804. By having the detachable cover 802 that includes texturized surface 804, the coating material deposited on the detachable cover 802 or shutter disk 800 is more likely bonded with the texturized surface 804 of the detachable cover 802.

In some embodiments of the present disclosure, the detachable cover 802 includes the texturized surface 804 made with or coated with the same material that the substrate process chamber 200 is intended to deposit on the substrate 902.

One of the advantages of having the detachable cover 802, which is capable of detaching from the rest of the shutter disk 800, is making the refurbishing/cleaning procedure for the shutter disk 800 easier and faster.

In the illustrated embodiment in FIG. 13, the detachable cover 802 is coupled to the shutter disk 800 with two bolts. However, the present disclosure does not limit the method of coupling the detachable cover 802 to the shutter disk 800 with the bolts. In a non-limiting example, the detachable cover 802 can be coupled to the shutter disk 800 using any suitable methods such as a magnetic coupling mechanism or a clip-on mechanism.

Figure 14:
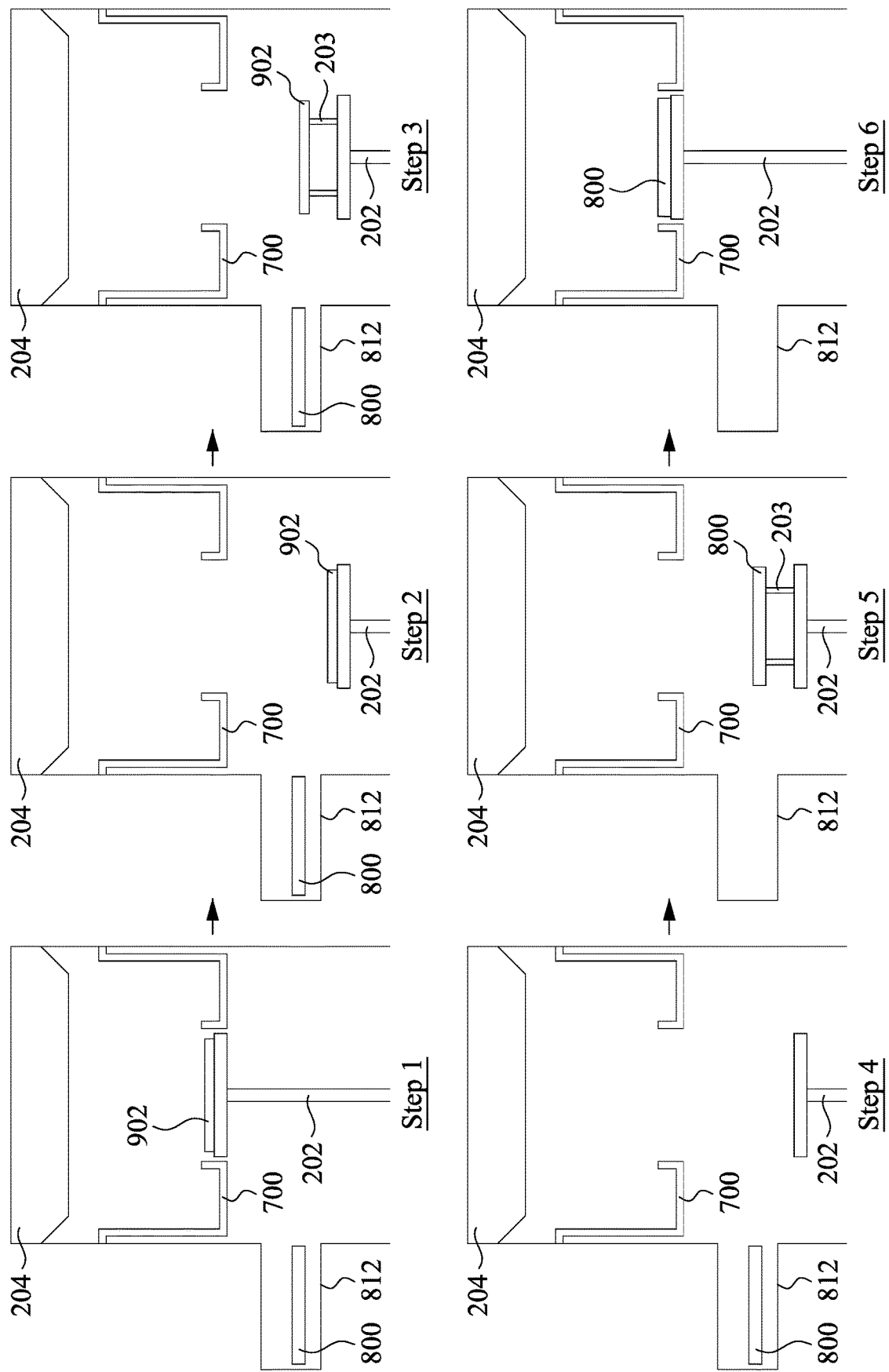
FIG. 14 is a diagram illustrating how the shutter disk 800 covers a top surface of a substrate pedestal 202.

FIG. 14 is a diagram illustrating how the shutter disk 800 covers the top surface of the substrate pedestal 202 according to one more embodiments of the present disclosure.

Referring to Step 1 of FIG. 14, Step 1 illustrates that the substrate pedestal 202 is in the upper position supporting the substrate 902 during a sputtering process. At this time, the thin film 904 is formed with material from the target 204 (and reactive gas supplied to the substrate process chamber 200) on the substrate 902. During the sputtering process, the shutter disk 800 with the in-situ measuring device 810 is stored in the shutter disk storage 812.

Referring to Step 2 of FIG. 14, Step 2 illustrates that the substrate pedestal 202 that supports the substrate 902 moves to the lower position with the substrate 902 so the substrate 902 is positioned closer to the bottom inner surface of the substrate process chamber 200.

Referring to Step 3 of FIG. 14, Step 3 illustrates that a plurality of pins 203 are used to rise the substrate 902 from the top surface of the substrate pedestal 202 so a wafer transfer arm (not shown) can transfer the substrate 902 out from the substrate process chamber 200 by holding the bottom of the substrate 902.

Referring to Step 4 of FIG. 14, Step 4 illustrates that the plurality of pins 203 are retracted to the substrate pedestal 202.

Referring to Step 5 of FIG. 14, Step 5 illustrates that the shutter disk 800 is moved out from the shutter disk storage 812 and placed above the substrate pedestal 202 by the shutter disk arm or robot arm (not shown). While the shutter disk 800 is above the top surface of the substrate pedestal 202, the plurality of pins 203 rise to support the shutter disk 800. While the plurality of pins 203 are holding the shutter disk 800, the shutter arm is retracted. Once the shutter arm is retracted, the plurality of pins 203 retracted that lower the shutter disk 800 onto the top surface of the substrate pedestal 202.

Referring to Step 6 of FIG. 14, Step 6 illustrates that the substrate pedestal 202 is in the upper position with the shutter disk 800 covering the top surface of the substrate pedestal 200 during a cleaning process.

Figure 15:
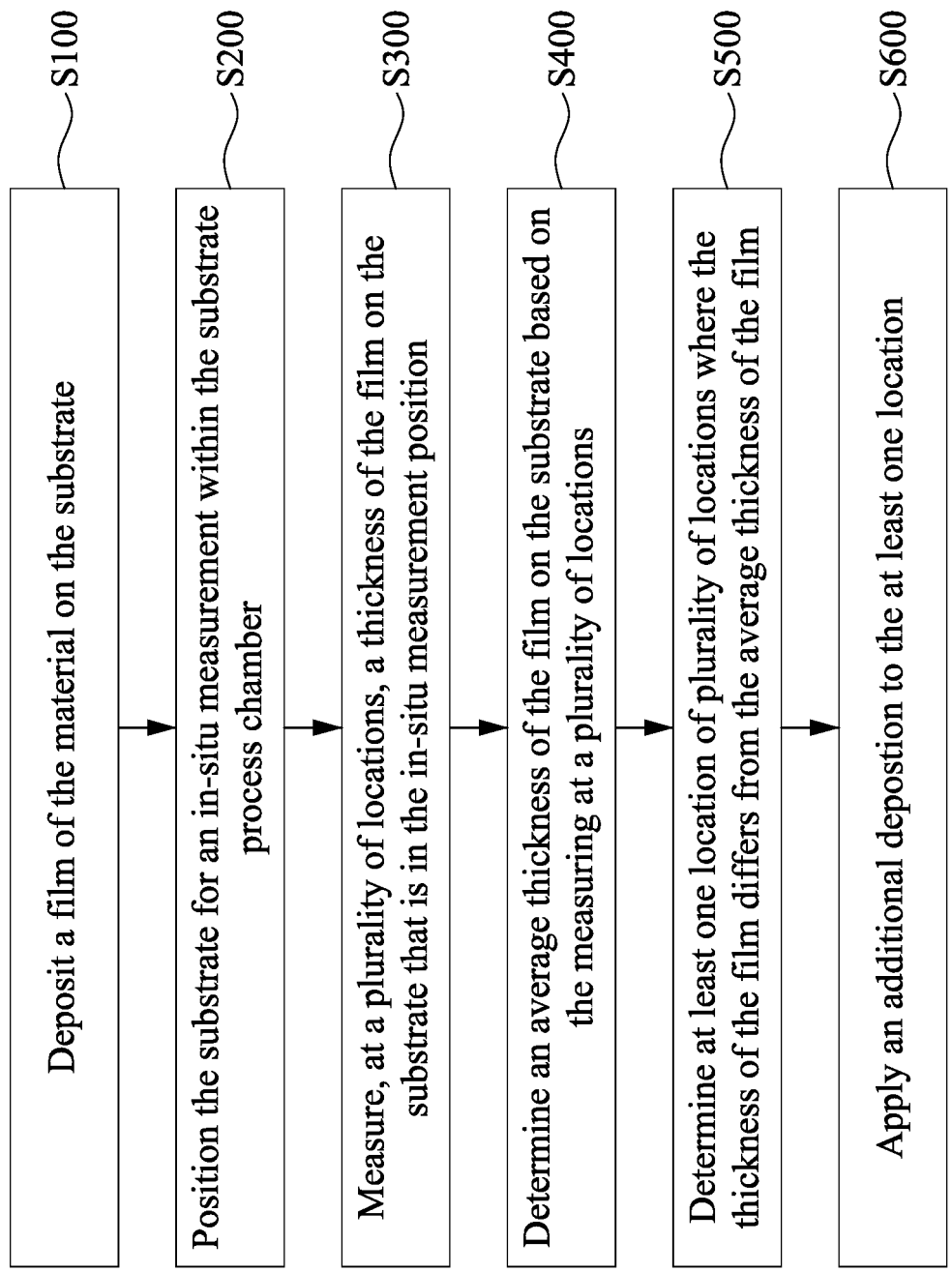
FIG. 15 is a flow chart illustrating a method of increasing uniformity of a thin film 904 on the substrate 902 according to one or more embodiments of the present disclosure.

FIG. 15 is a flow chart illustrating a method of increasing uniformity of a thin film 904 on the substrate 902 according to one or more embodiments of the present disclosure.

Referring to FIG. 15, the method of increasing uniformity of the thin film 904 on the substrate 902 includes: step S100 of depositing a thin film 904 on a substrate 902; step S200 of positioning the substrate 902 for the in-situ measurement; step S300 of in-situ measuring, at a plurality of locations, a thickness of the thin film 904 on the substrate 902; step S400 of determining an average thickness of the thin film 904 on the substrate 902 based on the measuring at a plurality of locations; step S500 of determining at least one of the plurality of locations where the thickness of the thin film 904 is less than the average thickness of the thin film 904; and step S600 of applying an additional deposition.

Step S100 of depositing the thin film 904 on the substrate 902 includes a step of depositing the thin film 904 on the substrate 902. As discussed above, during the sputtering, the positively charged argon ions bombard the target 204 and the momentum of the positively charged argon ion transfers to the target material to dislodge one or more atoms which eventually land on (deposit on) the substrate 902.

The step S200 of positioning the substrate 902 for the in-situ measurement includes a step of positioning the substrate 902 under the shutter disk 800 for the in-situ measurement. Shutter disk 800 includes the in-situ measuring device 810 for the in-situ measurement.

Step S300 of measuring, at the plurality of locations, the thickness of the thin film 904 on the substrate 902 includes a step of measuring the thickness of the thin film 904 at several locations using the in-situ measuring device 810. In-situ measuring device 810 transmits the measurement data to the controller 300 of the deposition system 100 directly or indirectly.

Step S400 of determining the average thickness of the thin film 904 on the substrate 902 based on the measuring at the plurality of locations includes a step of determining the average thickness of the thin film 904 based on the measurement data received. As discussed above, the input circuitry 302 of the controller 300 receives the measurement data from the in-situ measuring device 810. Processor 306 of the controller 300 determines the average thickness based on the measurement data. In alternative embodiments, the in-situ measuring device 810 includes a processer which determines the average thickness based on the measurement data and transmits the determined average thickness to the controller 300.

Step S500 of determining at least one of the plurality of locations where the thickness of the thin film 904 is less than the average thickness of the thin film 904 includes a step of determining at least one location on the substrate 902 where the thickness of the thin film 904 is less than the determined average thickness of the thin film 904. As discussed above, the processor 306 of the controller 300 determines at least one location on the substrate 902 where the thickness of the thin film 904 is less than the determined average thickness of the thin film 904. In alternative embodiments, the in-situ measuring device 810 includes a processer which determines the at least one location on the substrate 902 where the thickness of the thin film 904 is less than the determined average thickness of the thin film 904.

Step S600 of applying an additional deposition includes a step of applying an additional deposition on the determined location. In some embodiments of the present disclosure, step S600 further includes a step of transmitting the signal to the magnet member 206 based on the determined location, the signal adjusting a magnetic field (electromagnetic field) provided by a first magnet member. As discussed above, the controller 300 transmits the position control signal to the magnet member 206 to increase the magnitude of the magnetic field at the determined locations which results in an increase in ion bombardment on the determined locations. In some embodiments in accordance with the present disclosure, the controller 300 supplies more current to the electromagnet member 404 in the magnet member 206 to increase magnitude of the magnetic field and thereby the ion bombardment on the determined locations.

FIG. 16 is a flow chart illustrating a method of detecting a deposition defect in the thin film 904 deposited in the substrate process chamber 200 according to one or more embodiments of the present disclosure.

Referring to FIG. 16, the method of detecting a deposition defect in the thin film 904 deposited in the substrate process chamber 200 includes: step S1000 of depositing the thin film 904 on the substrate 902; step S1100 of positioning the substrate 902 for the in-situ measurement; step S1200 of measuring the thickness of the thin film 904 on the substrate 902 that is in the in-situ measurement position; step S1300 of measuring the composition of the thin film 904 on the substrate 902 that is in the in-situ measurement position; step S1400 of measuring the resistance of the thin film 904 on the substrate 902 that is in the in-situ measurement position; step S1500 of determining a defect based on the measured thickness of the film 904, the measured composition of the film 904, and the measured resistance of the film 904; and step S1600 of transmitting a warning signal to prevent producing additional substrates with the defects.

Step S1000 deposits the thin film 904 on the substrate 902 includes a step of depositing the thin film 904 on the substrate 902 using any suitable methods (e.g., PVD and CVD). If the sputtering which is a form of PVD is used as discussed above, during the sputtering, the positively charged argon ions bombard the target 204 and the momentum of the positively charged argon ion transfers to the target material to dislodge one or more atoms which eventually land on (deposit on) the substrate 902.

Step S1100 of positioning the substrate 902 for the in-situ measurement includes a step of positioning the substrate 902 under the shutter disk 800 for the in-situ measurement. Shutter disk 800 includes the in-situ measuring device 810 for the in-situ measurement.

In some embodiments of the present disclosure, in-situ measuring device 810 includes one or more optical measurement devices 840 (e.g., shutter disk 800 shown in FIG. 2). In some embodiments, the in-situ measuring device 810 includes one or more x-ray measurement devices 830 (e.g., shutter disk 800 shown in FIG. 6). In some embodiments, the in-situ measuring device 810 includes one or more resistivity measurement devices 820 (e.g., shutter disk 800 shown in FIG. 8). In some embodiments, the in-situ measuring device 810 includes more than two types of the measurement devices (e.g., shutter disk 800 shown in FIG. 10).

In some embodiments of the present disclosure, the substrate process chamber 200 includes one shutter disk 800 in the shutter disk storage 812. In some embodiments, two or more shutter disks 800 are stored in the shutter disk storage 812. In a non-limiting example, the shutter disk storage 812 is configured to store multiple shutter disks 800, each can measure different characteristics (e.g., thickness, resistance, and composition) from the thin film 904 on the substrate 902. In some embodiments, different shutter disk 800 can be positioned above the substrate 902 for different measurements (e.g., thickness measurement, resistance measurement, and composition measurement).

As discussed above, after the deposition process, the substrate pedestal 202 that supports the substrate 902 then moves to an in-situ measurement positon (e.g., lower position) with the substrate 902 so the substrate 902 is positioned closer to the bottom inner surface of the substrate process chamber 200. While the substrate pedestal 202 is in the measurement position, the shutter disk 800, which is generally stored in the shutter disk storage 812 when it is not in use, is placed above the substrate 902 at a certain distance from the substrate 902 in order to measure at least one of the film characteristics (e.g., thickness, resistance, and composition) from the thin film 904 on the substrate 902.

Step S1200 of measuring the thickness of the thin film 904 includes a step of measuring the thickness of the thin film 904 on the substrate 902 (that is in the in-situ measurement positon) with the optical measurement device 840 on the shutter disk 800.

In some embodiments, when the substrate process chamber 200 does not equipped with the shutter disk 800 that can measure the thickness of the thin film 904 on the substrate 902, the substrate 902 can be transferred to other substrate process chamber 200 with a shutter disk 800 including the optical measurement devices 840 (e.g., other substrate process chamber 200 configured in the same tool). In some embodiments, the substrate 902 is returned from the other substrate process chamber 200 after completing the measurement at the other substrate process chamber 200. In some embodiment, the substrate 902 does not return from the other substrate process chamber 200, and the rest of the process (e.g., measurement, deposition, and redepositing) is performed at the other substrate process chamber 200.

Step S1300 of measuring the composition of the thin film 904 includes a step of measuring the composition of the thin film 904 on the substrate 902 (that is in the in-situ measurement positon) with the x-ray measurement device 830 on the shutter disk 800.

In some embodiments, when the substrate process chamber 200 does not equipped with the shutter disk 800 that can measure the composition of the thin film 904 on the substrate 902, the substrate 902 can be transferred to other substrate process chamber 200 with a shutter disk 800 including the x-ray measurement devices 830 (e.g., other substrate process chamber 200 configured in the same tool). In some embodiments, the substrate 902 is returned from the other substrate process chamber 200 after completing the measurement at the other substrate process chamber 200. In some embodiment, the substrate 902 does not return from the other substrate process chamber 200, and the rest of the process (e.g., measurement, deposition, and redepositing) is performed at the other substrate process chamber 200.

Step S1400 of measuring the resistance of the thin film 904 includes a step of measuring the resistance of the thin film 904 on the substrate 902 (that is in the in-situ measurement positon) with the resistivity measurement device 820 on the shutter disk 800.

In some embodiments, when the substrate process chamber 200 does not equipped with the shutter disk 800 that can measure the resistance of the thin film 904 on the substrate 902, the substrate 902 can be transferred to other substrate process chamber 200 with a shutter disk 800 including the resistivity measurement devices 820 (e.g., other substrate process chamber 200 configured in the same tool). In some embodiments, the substrate 902 is returned from the other substrate process chamber 200 after completing the measurement at the other substrate process chamber 200. In some embodiment, the substrate 902 does not return from the other substrate process chamber 200, and the rest of the process (e.g., measurement, deposition, and redepositing) is performed at the other substrate process chamber 200.

Step S1500 of determining a defect based on the measured thickness of the film 904, the measured composition of the thin film 904, and the measured resistance of the thin film 904 includes a step of comparing the measured characteristics of the thin film 904 with the process specification in order to determine the defect in the thin film 904.

Step S1600 of transmitting a warning signal includes a step of generating and transmitting the warning signal when the controller 300 determines that at least one of the measured thin film characteristics (e.g., thickness, resistance, and composition) does not meet the process specification.

Utilizing the in-situ measuring device 810 will produce a substantial cost savings by monitoring and/or verifying the result of the deposition process without transferring the substrate 902 to the metrology tool. In other words, the fabrication operator can respond to the defect in the thin film 904 early on to save cost of production by identifying and correcting problems with the deposition system 100.

According to one or more embodiments of the present disclosure, a method of increasing uniformity of a thin film on a substrate includes depositing the thin film on the substrate. The thin film is deposited on the substrate using any suitable methods such as sputtering. The method includes positioning the substrate for an in-situ measurement. To position the substrate for the in-situ measurement, a substrate pedestal, which supports the substrate, changes its position to the in-situ measurement position (e.g., lower position). The method includes measuring, at a plurality of locations, a thickness of the thin film on the substrate while the substrate pedestal is in the in-situ measurement position. The method includes determining an average thickness of the thin film on the substrate based on the measuring at a plurality of locations. The controller determines the average thickness of the thin film on the substrate based on the measurement data from the in-situ measuring device. The method includes determining at least one of the plurality of locations where the thickness of the thin film is less than the average thickness of the thin film. The controller determines one or more locations where more target material should be deposited based on the average thickness. The method includes applying an additional deposition to the at least one location where more target material should be deposited based on the average thickness.

According to one or more embodiments of the present disclosure, a method of detecting a deposition defect in a deposition chamber includes depositing a thin film on a substrate. The method includes positioning the substrate for an in-situ measurement. To position the substrate for the in-situ measurement, a substrate pedestal, which supports the substrate, changes its position to the in-situ measurement position (e.g., lower position). The method includes measuring a thickness of the thin film on the substrate while the substrate pedestal is in the in-situ measurement position. The method includes measuring a composition of the thin film on the substrate while the substrate pedestal is in the in-situ measurement position. The method includes measuring a resistance of the thin film on the substrate while the substrate pedestal is in the in-situ measurement position. The method includes determining a defect by comparing a process specification with the measured thickness of the film, the measured composition of the film, and the measured resistance of the film. The method includes transmitting a warning signal in response to the determined defect to stop the deposition chamber.

According to one or more embodiments of the present disclosure, a deposition system is provided capable of measuring at least one of the film characteristics (e.g., thickness, resistance, and composition) in the deposition system. The deposition system in accordance with the present disclosure includes a substrate process chamber. The deposition system in accordance with the present disclosure include a substrate pedestal in the substrate process chamber, the substrate pedestal configured to support a substrate, and a target enclosing the substrate process chamber. A shutter disk including an in-situ measuring device is provided.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of depositing a material from a target onto a substrate in a substrate process chamber, comprising:
   depositing a film of the material on the substrate;
   positioning the substrate for an in-situ measurement within the substrate process chamber;
   measuring, at a plurality of locations, a thickness of the film on the substrate that is in an in-situ measurement position;
   determining an average thickness of the film on the substrate based on the measuring at the plurality of locations; and
   determining at least one location of the plurality of locations where the thickness of the film differs from the average thickness of the film.

2. The method according to claim 1, wherein the positioning the substrate for the in-situ measurement includes arranging the substrate below a shutter disk.

3. The method according to claim 2, wherein the shutter disk includes at least one optical measurement device having a light source and a light detector, the light detector positioned to detect a light emitted from the light source that is reflected by the film.

4. The method according to claim 1, further comprising applying an additional deposition to the at least one location, the applying the additional deposition includes arranging a magnet member on a target corresponding to the determined at least one location.

5. The method according to claim 1, further comprising applying an additional deposition to the at least one location, the applying the additional deposition includes:
   applying more current to a magnet member; and
   increasing a magnitude of ion bombardment on an area on the target which is located directly above the determined at least one location.

6. A method of detecting a deposition defect in a deposition chamber, comprising:
   depositing a film on a substrate;
   positioning the substrate for an in-situ measurement;
   measuring a thickness of the film on the substrate that is in an in-situ measurement position;
   measuring a composition of the film on the substrate that is in the in-situ measurement position;
   measuring a resistance of the film on the substrate that is in the in-situ measurement position;
   determining a defect based on one or more of the measured thickness of the film, the measured composition of the film, and the measured resistance of the film; and
   transmitting a warning signal in response to the determined defect.

7. The method according to claim 6, wherein the positioning the substrate for the in-situ measurement includes arranging the substrate below a shutter disk.

8. The method according to claim 7, wherein the shutter disk includes at least one x-ray measurement device having an x-ray source and an x-ray detector, the x-ray detector positioned to detect fluorescence released from the thin film in response to the x-ray emitted to the thin film from the x-ray source.

9. The method according to claim 7, wherein the shutter disk includes at least one optical measurement device having a light source and a light detector, the light detector positioned to detect a light emitted from the light source that is reflected by the film.

10. The method according to claim 7, wherein the shutter disk includes at least one resistivity measurement device having four in-line probes that are equally spaced apart from each other.

11. A deposition system, comprising:
a substrate process chamber;
a substrate pedestal in the substrate process chamber, the substrate pedestal configured to support a substrate;
a target enclosing the substrate process chamber; and
a shutter disk including an in-situ measuring device, the in-situ measuring device disposed on a bottom of the shutter disk.

12. The deposition system according to claim 11, wherein the in-situ measuring device includes at least one x-ray measurement device having an x-ray source and an x-ray detector, the x-ray detector positioned to detect fluorescence released from a thin film on the substrate in response to the x-ray emitted to the thin film from the x-ray source.

13. The deposition system according to claim 11, wherein the in-situ measuring device includes at least one optical measurement device having a light source and a light detector, the light detector positioned to detect a light emitted from the light source that is reflected by a film on the substrate.

14. The deposition system according to claim 11, wherein the in-situ measuring device includes at least one resistivity measurement device having four in-line probes that are equally spaced apart from each other.

15. The deposition system according to claim 11, wherein the shutter disk includes a detachable cover.

16. The deposition system according to claim 15, wherein a top surface of the detachable cover includes a texturized surface.

17. The deposition system according to claim 15, wherein the detachable cover is coated with a material substantially similar to a material of the target.

18. The deposition system according to claim 14, wherein the four in-line probes that are equally spaced apart from each other are foldable or retractable.

19. The deposition system according to claim 14, wherein the four in-line probes, in operation, contact a thin film on the substrate and measure a sheet resistance of the thin film.

20. The deposition system according to claim 11, wherein the in-situ measuring device includes at least one x-ray measurement device, at least one resistivity measurement device, and at least one optical measurement device, and wherein each of the measurement devices sequentially measures different properties of a thin film disposed on the substrate.

* * * * *